(12) United States Patent
Tanoue

(10) Patent No.: US 11,752,576 B2
(45) Date of Patent: Sep. 12, 2023

(54) SUBSTRATE PROCESSING SYSTEM FOR REMOVING PERIPHERAL PORTION OF SUBSTRATE, SUBSTRATE PROCESSING METHOD AND COMPUTER READABLE RECORDING MEDIUM THEREOF

(71) Applicant: Tokyo Electron Limited, Tokyo (JP)

(72) Inventor: Hayato Tanoue, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 362 days.

(21) Appl. No.: 16/978,211

(22) PCT Filed: Mar. 1, 2019

(86) PCT No.: PCT/JP2019/008120
§ 371 (c)(1),
(2) Date: Sep. 4, 2020

(87) PCT Pub. No.: WO2019/176589
PCT Pub. Date: Sep. 19, 2019

(65) Prior Publication Data
US 2021/0039203 A1  Feb. 11, 2021

(30) Foreign Application Priority Data

Mar. 14, 2018 (JP) ................................. 2018-047159
Apr. 27, 2018 (JP) ................................. 2018-087711

(51) Int. Cl.
*B23K 26/36* (2014.01)
*H01L 21/02* (2006.01)
(Continued)

(52) U.S. Cl.
CPC ........ *B23K 26/36* (2013.01); *H01L 21/02013* (2013.01); *H01L 21/268* (2013.01); *H01L 21/304* (2013.01)

(58) Field of Classification Search
CPC .... B23K 26/36; B23K 2101/40; B23K 26/53; B23K 26/57; B23K 26/362;
(Continued)

(56) References Cited

U.S. PATENT DOCUMENTS

| 2006/0079155 | A1 | 4/2006 | Nakamura |
| 2015/0140785 | A1* | 5/2015 | Kwak ............... H01L 21/02013 438/464 |
| 2018/0076043 | A1 | 3/2018 | Ito |

FOREIGN PATENT DOCUMENTS

| JP | 09-216152 A | 8/1997 |
| JP | 2004-111606 A | 4/2004 |

(Continued)

OTHER PUBLICATIONS

English Translation of the Written Opinion of the International Searching Authority for PCT/JP2019/016467 dated Oct. 27, 2020 and original of the Written Opinion thereof.
(Continued)

*Primary Examiner* — John P. Dulka
(74) *Attorney, Agent, or Firm* — Shih IP Law Group, PLLC.

(57) ABSTRACT

A substrate processing system configured to process a substrate includes a modification layer forming apparatus configured to form a modification layer within the substrate along a boundary between a peripheral portion of the substrate to be removed and a central portion of the substrate; and a periphery removing apparatus configured to remove the peripheral portion starting from the modification layer.

28 Claims, 25 Drawing Sheets

(51) Int. Cl.
*H01L 21/268* (2006.01)
*H01L 21/304* (2006.01)

(58) Field of Classification Search
CPC ............. H01L 21/02013; H01L 21/268; H01L 21/304; H01L 21/67092; H01L 21/187
See application file for complete search history.

(56) References Cited

FOREIGN PATENT DOCUMENTS

| | | | |
|---|---|---|---|
| JP | 2004111606 A | * | 4/2004 |
| JP | 2008153420 A | | 7/2008 |
| JP | 2009-135342 A | | 6/2009 |
| JP | 2009131942 A | | 6/2009 |
| JP | 2011-159798 A | | 8/2011 |
| JP | 2012-064667 A | | 3/2012 |
| JP | 2014-167966 A | | 9/2014 |
| JP | 2017-071074 A | | 4/2017 |
| JP | 2017-191825 A | | 10/2017 |

OTHER PUBLICATIONS

International Search Report for PCT/JP2019/008120 dated May 28, 2019, 4 pages.

* cited by examiner

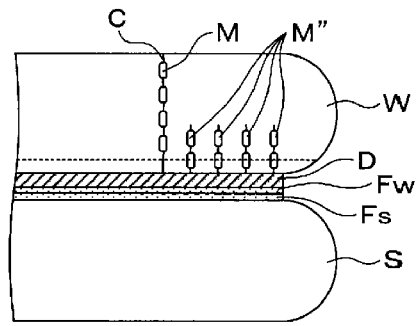
FIG. 19A
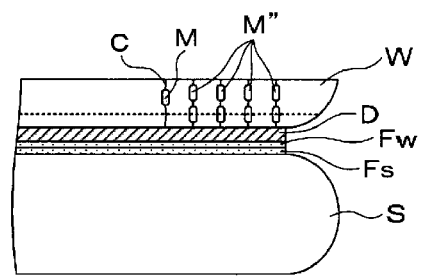
FIG. 19B
FIG. 20
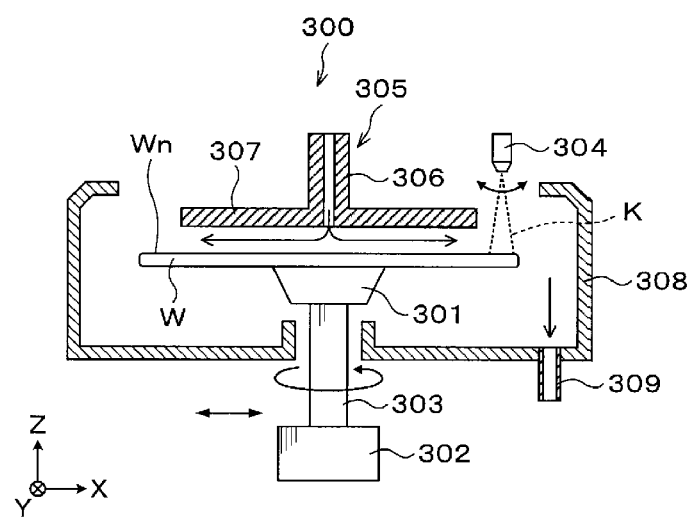

FIG. 33A
FIG. 33B
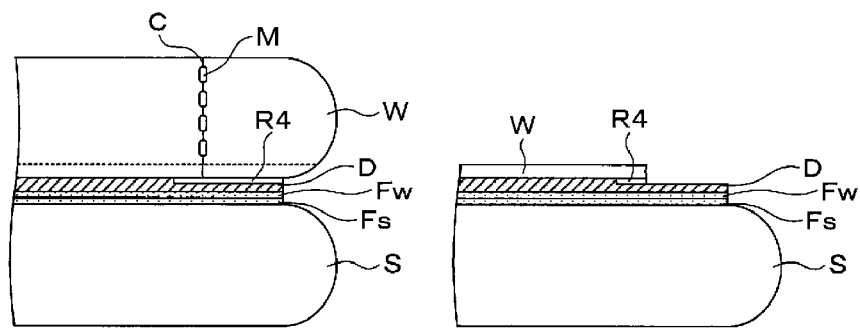
FIG. 34
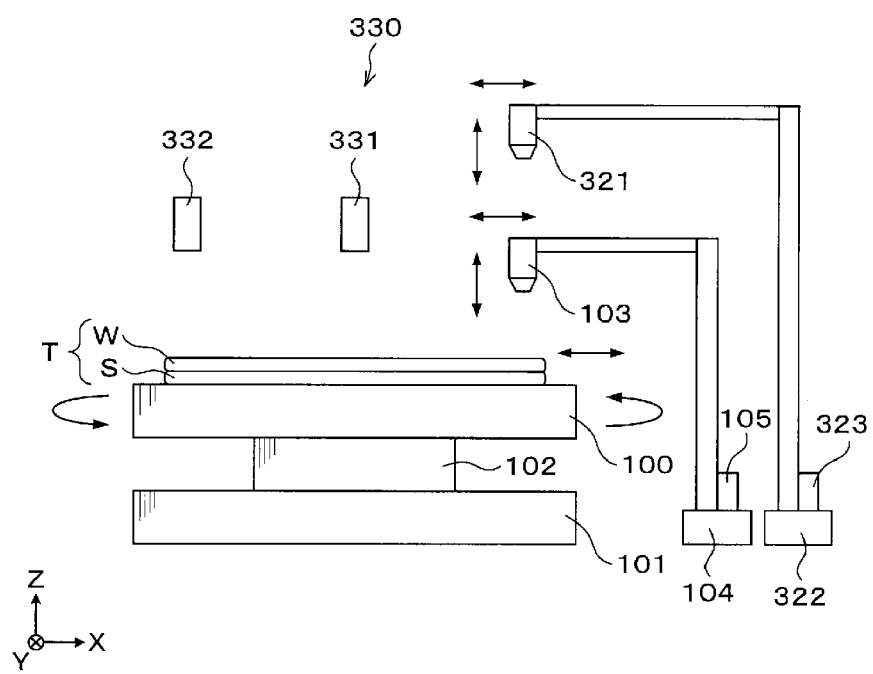

SUBSTRATE PROCESSING SYSTEM FOR REMOVING PERIPHERAL PORTION OF SUBSTRATE, SUBSTRATE PROCESSING METHOD AND COMPUTER READABLE RECORDING MEDIUM THEREOF

TECHNICAL FIELD

Cross-Reference to Related Application

This application claims the benefit of Japanese Patent Application No. 2018-047159 filed on Mar. 14, 2018 and Japanese Patent Application No. 2018-087711 filed on Apr. 27, 2018, the entire disclosures of which are incorporated herein by reference.

The various aspects and embodiments described herein pertain generally to a substrate processing system, a substrate processing method, and a computer-readable recording medium.

BACKGROUND

Recently, in a manufacturing process for a semiconductor device, a semiconductor wafer (hereinafter, simply referred to as "wafer") having devices such as a plurality of electronic circuits formed on a front surface thereof is thinned by grinding a rear surface of the wafer. If this thinned wafer is transferred or a subsequent processing is performed on this thinned wafer, there is a likelihood that the wafer may be bent or suffer a crack. Thus, to reinforce the wafer, the wafer is attached to, for example, a support board.

Typically, a peripheral portion of the wafer is chamfered. If, however, the wafer is ground as stated above, the peripheral portion of the wafer is given a sharp pointed shape (a so-called knife edge shape). If so, chipping takes place at the peripheral portion of the wafer, and the wafer may be damaged. Thus, there is performed a so-called edge trimming of trimming the peripheral portion of the wafer prior to the grinding processing.

By way of example, Patent Document 1 describes a vertical-axis type end surface grinding apparatus as an apparatus configured to perform the edge trimming. When grinding the peripheral portion of the wafer by using this end surface grinding apparatus, the wafer having the support board attached thereto is fixed on a table, and the table is rotated around an axis parallel to a vertical axis. Then, after a wheel as a grinding tool is rotated by spinning a spindle, the spindle is moved in a vertical direction such that a grinding surface of the wheel comes into contact with the wafer, so that the peripheral portion of the wafer is ground.

PRIOR ART DOCUMENT

Patent Document 1: Japanese Patent Laid-open Publication No. H09-216152

DISCLOSURE OF THE INVENTION

Problems to be Solved by the Invention
Means for Solving the Problems

In one exemplary embodiment, a substrate processing system configured to process a substrate includes a modification layer forming apparatus configured to form a modification layer within the substrate along a boundary between a peripheral portion of the substrate to be removed and a central portion of the substrate; and a periphery removing apparatus configured to remove the peripheral portion starting from the modification layer.

In another exemplary embodiment, a substrate processing method of processing a substrate includes forming a modification layer within a first substrate along a boundary between a peripheral portion of the first substrate to be removed and a central portion of the first substrate; removing the peripheral portion starting from the modification layer; and bonding the first substrate and a second substrate.

In still another exemplary embodiment, there is provided a computer-readable recording medium having stored thereon computer-executable instructions that, in response to execution, cause a substrate processing system to perform a substrate processing method.

Effect of the Invention

BRIEF DESCRIPTION OF THE DRAWINGS

FIG. 19A and FIG. 19B are longitudinal cross sectional views illustrating a state in which modification layers are formed in a processing target wafer according to another exemplary embodiment.

FIG. 20 is a side view illustrating a schematic configuration of an interface processing apparatus.

FIG. 33A and FIG. 33B are explanatory diagrams illustrating a case where a modification layer is located at an outer side than an inner periphery of a modification surface in a diametrical direction.

FIG. 34 is a side view illustrating a schematic configuration of a processing apparatus.

DETAILED DESCRIPTION

Figure 1:
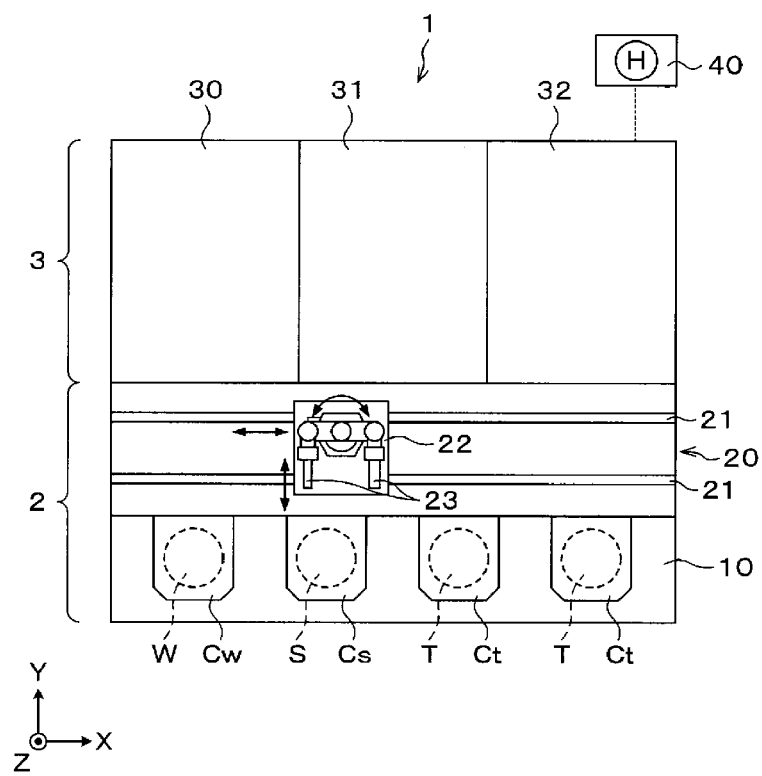
FIG. 1 is a plan view schematically illustrating a configuration of a substrate processing system according to a first exemplary embodiment.

Hereinafter, exemplary embodiments will be described with reference to the accompanying drawings. In the specification and the drawings, parts having substantially same functions and configurations will be assigned same reference numerals, and redundant description thereof will be omitted.

First, a first exemplary embodiment will be explained. FIG. 1 is a plan view schematically illustrating a configuration of a substrate processing system 1 according to the first exemplary embodiment. In the following, in order to clarify positional relationships, the X-axis direction, Y-axis direction and Z-axis direction which are orthogonal to each other will be defined. The positive Z-axis direction will be regarded as a vertically upward direction.

Figure 2:
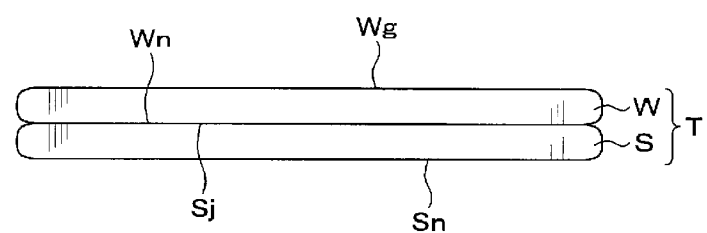
FIG. 2 is a side view illustrating a schematic structure of a combined wafer.

In the substrate processing system 1, a combined wafer T is prepared as a combined substrate by bonding a processing target wafer W as a first substrate and a support wafer S as a second substrate, as shown in FIG. 2, and the processing target wafer W is thinned. Hereinafter, in the processing target wafer W, a to-be-processed surface (a surface opposite to a surface bonded to the support wafer S) will be referred to as "processing surface Wg," and the surface opposite to the processing surface Wg will be referred to as "non-processing surface Wn." Further, in the support wafer S, a surface bonded to the processing target wafer W will be referred to as "bonding surface Sj," and a surface opposite to the bonding surface Sj will be referred to as "non-bonding surface Sn."

The processing target wafer W is a semiconductor wafer such as, but not limited to, a silicon wafer, and is provided with a plurality of devices formed on the non-processing surface Wn thereof. Further, a peripheral portion of the processing target wafer W is chamfered, and a thickness of the peripheral portion of the processing target wafer W decreases toward a leading end thereof on a cross section thereof.

The support wafer S is a wafer configured to support the processing target wafer W. Further, the support wafer S serves as a protection member which protects the devices on the non-processing surface Wn of the processing target wafer W. Further, if the support wafer S has a plurality of devices formed on the bonding surface Sj thereof, a device layer (not shown) is formed on the bonding surface Sj, the same as in the processing target wafer W.

As depicted in FIG. 1, the substrate processing system 1 is equipped with a carry-in/out station 2 in which cassettes Cw, Cs and Ct respectively capable of accommodating therein a multiple number of processing target wafers W, a multiple number of support wafers S and a multiple number of combined wafers T are carried to/from the outside; and a processing station 3 equipped with various kinds of processing apparatuses configured to perform preset processings on the processing target wafers W, the support wafers S and the combined wafers T. The carry-in/out station 2 and the processing station 3 are connected as one body.

The carry-in/out station 2 is equipped with a cassette placing table 10. In the shown example, a plurality of, for example, four cassettes Cw, Cs and Ct can be arranged in a row in the X-axis direction on the cassette placing table 10. Further, the number of the cassettes Cw, Cs and Ct placed on the cassette placing table 10 is not limited to the example of the present exemplary embodiment but can be selected as required.

In the carry-in/out station 2, a wafer transfer section 20 is provided adjacent to the cassette placing table 10. Provided in the wafer transfer section 20 is a wafer transfer device 22 configured to be movable on a transfer path 21 which is elongated in the X-axis direction. The wafer transfer device 22 is equipped with, for example, two transfer arms 23 configured to hold and transfer the combined wafer T. Each transfer arm 23 is configured to be movable in a horizontal direction and a vertical direction and pivotable around a horizontal axis and a vertical axis. Further, the configuration of the transfer arm 23 is not limited to the exemplary embodiment, and various other configurations may be adopted.

The processing station 3 includes a bonding apparatus 30 configured to bond the processing target wafer W and the support wafer S; a modification layer forming apparatus 31 configured to form a modification layer within the processing target wafer W; and a processing apparatus 32 configured to process the processing surface Wg of the processing target wafer W by grinding it. The bonding apparatus 30, the modification layer forming apparatus 31 and the processing apparatus 32 are arranged at a positive Y-axis side of the wafer transfer section 20 in sequence from a negative X-axis side toward a positive X-axis side. Further, the number and the layout of the bonding apparatus 30, the modification layer forming apparatus 31 and the processing apparatus 32 are not limited to the example of the present exemplary embodiment, and may be selected as required. Further, in the present exemplary embodiment, the processing apparatus 32 serves as a periphery removing apparatus of the present disclosure.

The above-described substrate processing system 1 is equipped with a controller 40. The controller 40 is implemented by, for example, a computer, and includes a program storage (not shown). A program for controlling a processing of the processing target wafer W, the support wafer S and the combined wafer T in the substrate processing system 1 is stored in the program storage. Further, the program storage also stores therein a program for implementing a wafer processing to be described later in the substrate processing system 1 by controlling the above-described various processing apparatuses and a driving system such as the transfer devices. Further, the programs may be recorded in a computer-readable recording medium H such as a hard disk (HD), a flexible disk (FD), a compact disk (CD), a magnet optical disk (MO) or a memory card, and may be installed from this recording medium H to the controller 40.

Now, the bonding apparatus 30, the modification layer forming apparatus 31 and the processing apparatus 32 will be explained.

The bonding apparatus 30 is configured to bond the non-processing surface Wn of the processing target wafer W and the bonding surface Sj of the support wafer S by a Van der Waals force and a hydrogen bond (intermolecular force). For this bonding, it is desirable that the non-processing surface Wn and the bonding surface Sj are modified and hydrophilized. To elaborate, to modify the non-processing surface Wn and the bonding surface Sj, an oxygen gas or a nitrogen gas as a processing gas is ionized by being excited into plasma in, for example, a decompressed atmosphere. Oxygen ions or nitrogen ions are irradiated to the non-processing surface Wn and the bonding surface Sj, so that the non-processing surface Wn and the bonding surface Sj are plasma-processed and activated. Further, by supplying pure water onto the modified non-processing surface Wn and bonding surface Sj, the non-processing surface Wn and the bonding surface Sj are hydrophilized. The bonding apparatus 30 may have a commonly known configuration, and a bonding apparatus well known in the art may be used.

Figure 3:
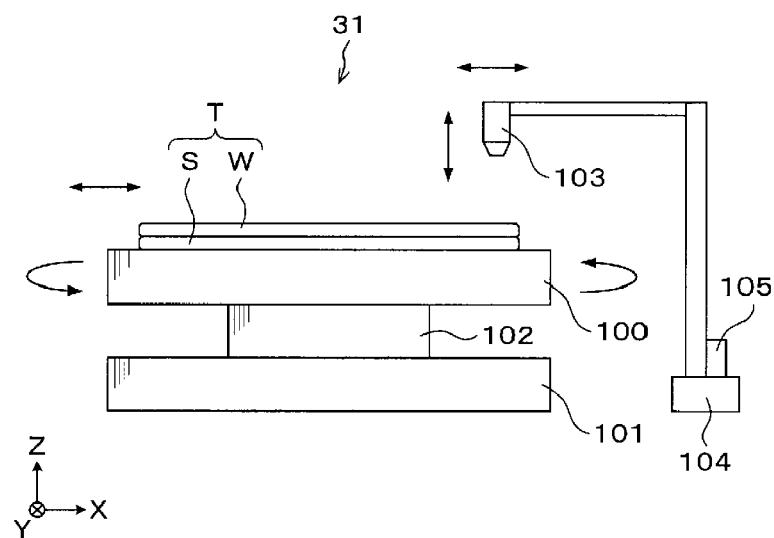
FIG. 3 is a side view illustrating a schematic configuration of a modification layer forming apparatus.

The modification layer forming apparatus 31 is configured to form a modification layer by irradiating laser light to the inside of the processing target wafer W. The modification layer forming apparatus 31 is equipped with a chuck 100 as a holder configured to hold the combined wafer T in the state that the processing target wafer W is placed at an upper side and the support wafer S is placed at a lower side, as shown in FIG. 3. The chuck 100 is configured to be movable in the X-axis direction and the Y-axis direction by a moving mechanism 101. The moving mechanism 101 is implemented by a general precise XY-stage. Further, the chuck 100 is also configured to be rotatable around a vertical axis by a rotating mechanism 102.

Figure 4:
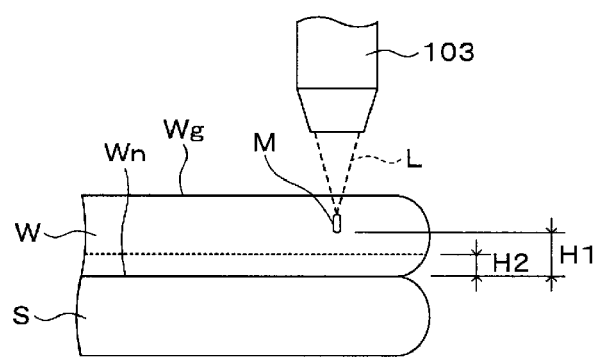
FIG. 4 is a longitudinal cross sectional view illustrating a state in which a modification layer is formed in a processing target wafer.

A laser head 103 configured to irradiate laser light to the inside of the processing target wafer W is provided above the chuck 100 as a modification unit. The laser head 103 concentrates and irradiates the laser light having a wavelength featuring transmissivity for the processing target wafer W to a preset position within the processing target wafer W as laser light in a high-frequency pulse shape emitted from a laser light oscillator (not shown). Accordingly, as shown in FIG. 4, a portion within the processing target wafer W to which laser light L is concentrated is modified, so that a modification layer M is formed. The modification layer M is elongated in a plate thickness direction and has an aspect ratio with a vertically longer side. As depicted in FIG. 3, the laser head 103 may be configured to be movable in the X-axis direction and the Y-axis direction by a moving mechanism 104. The moving mechanism 104 is implemented by a general precise XY-stage. Further, the laser head 103 may be configured to be movable in the Z-axis direction by an elevating mechanism 105.

Figure 5:
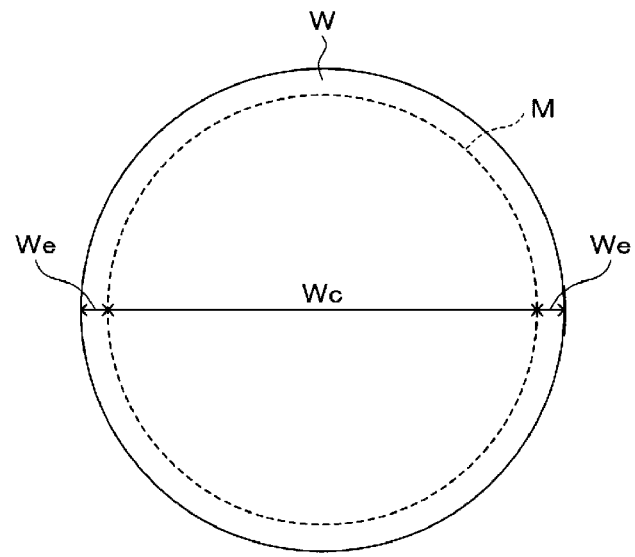
FIG. 5 is a plan view illustrating the state in which the modification layer is formed in the processing target wafer.

In the modification layer forming apparatus 31, after the combined wafer T is held by the chuck 100, the chuck 100 is moved in the horizontal direction by the moving mechanism 101 to thereby perform centering of the combined water T. Further, a position of the laser head 103 is adjusted by the moving mechanism 104 such that the laser head 103 is located directly above a preset position of the combined wafer T (processing target wafer W). Thereafter, while rotating the chuck 100 with the rotating mechanism 102, the laser light L is irradiated to the inside of the processing target wafer W from the laser head 103, so that the modification layer M having an annular shape is formed in the processing target wafer W, as depicted in FIG. 5. Further, to carry out the above-stated position adjustment, the modification layer forming apparatus 31 may be provided with a camera (not shown) configured to image a position of the combined wafer T.

A position in the processing target wafer W where the modification layer M is formed will be elaborated. In the substrate processing system 1, the processing surface Wg of the processing target wafer W bonded to the support wafer S is ground. To avoid formation of a knife edge at the peripheral portion of the ground processing target wafer W, however, the peripheral portion is removed before the grinding is performed. The modification layer M serves as a starting point of this removal of the peripheral portion of the processing target wafer W. As depicted in FIG. 5, the modification layer M is formed to have the annular shape along a boundary between a peripheral portion We of the processing target wafer W to be removed and a central portion Wc of the processing target wafer W. Further, the peripheral portion We is in a range from, e.g., 0.5 mm to 2.0 mm from an edge of the processing target wafer W in a diametrical direction, and includes a chamfered portion.

Furthermore, as illustrated in FIG. 4, a lower end of the modification layer M is located above a target surface (indicated by a dashed line in FIG. 4) of the processing target wafer W after being ground. That is, a distance H1 between the lower end of the modification layer M and the non-processing surface Wn of the processing target wafer W is larger than a target thickness H2 of the processing target wafer W after being ground. Though the distance H1 is set to be of any required value, it is larger than the target thickness H2 by, for example, 5 µm to 10 µm. In this case, the modification layer M does not remain in the processing target wafer W after being ground.

Furthermore, in the modification layer forming apparatus 31 according to the present exemplary embodiment, though the chuck 100 is moved in the horizontal direction, the laser head 103 may be moved in the horizontal direction, or both the chuck 100 and the laser head 103 may be moved in the horizontal direction. Further, though the chuck 100 is rotated, the laser head 103 may be rotated instead.

The processing apparatus 32 is configured to process the processing surface Wg of the processing target wafer W by grinding it. To elaborate, the processing apparatus 32 is equipped with, for example, a grinding unit configured to grind the processing surface Wg, a cleaning unit configured to clean the processing surface Wg of the processing target wafer W and the non-bonding surface Sn of the support wafer S, and so forth.

Figure 6:
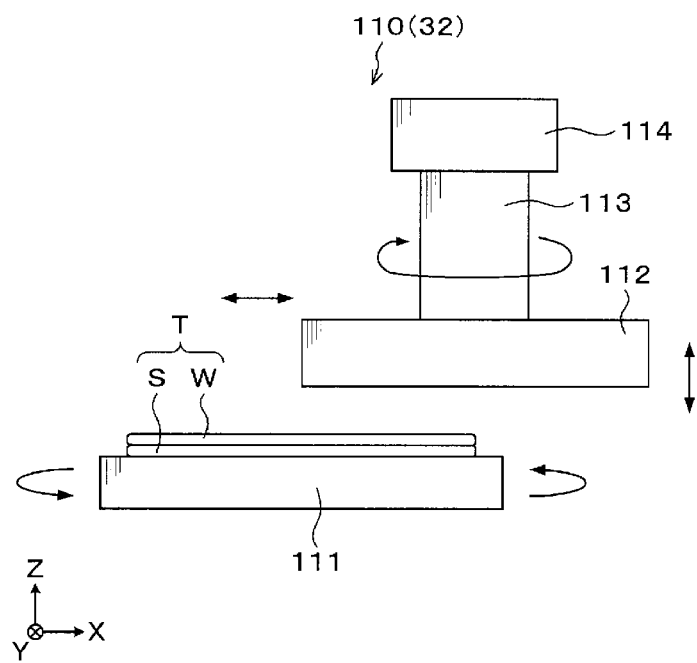
FIG. 6 is a side view illustrating a schematic configuration of a grinding unit of a processing apparatus.

As shown in FIG. 6, the grinding unit 110 has a chuck 111 configured to hold the combined wafer T in the state that the processing target wafer W is placed at an upper side and the support wafer S is placed at a lower side. The chuck 111 is configured to be rotatable around a vertical axis by a rotating mechanism (not shown).

A grinding whetstone 112 having an annular shape is provided above the chuck 111. The grinding whetstone 112 is provided with a driver 114 via a spindle 113. The driver 114 includes a motor (not shown) embedded therein. This driver 114 rotates the grinding whetstone 112 and moves it in a vertical direction and a horizontal direction.

In the grinding unit 110, by rotating the chuck 111 and the grinding whetstone 112 respectively in the state that the processing target wafer W held by the chuck 111 is in contact with a part of a circular arc of the grinding whetstone 112, the processing surface Wg of the processing target wafer W is ground.

Now, a wafer processing performed by using the substrate processing system 1 having the above-described configuration will be discussed.

First, the cassette Cw accommodating therein the multiple number of processing target wafers W and the cassette Cs accommodating therein the multiple number of support wafers S are placed on the cassette placing table 10 of the carry-in/out station 2.

Then, a processing target wafer W is taken out of the cassette Cw by the wafer transfer device 22, and transferred into the bonding apparatus 30. Subsequently, a support wafer S within the cassette Cs is also taken out by the wafer transfer device 22, and transferred into the bonding apparatus 30. In the bonding apparatus 30, the processing target wafer W and the support wafer S are bonded by a Van der Waals force and an intermolecular force in the state that the processing target wafer W is placed at an upper side and the support wafer S is placed at a lower side, so that the combined wafer T is formed. At this time, if a non-processing surface Wn of the processing target wafer W and a bonding surface Sj of the support wafer S are activated by, for example, oxygen ions or nitrogen ions in plasma, the Van der Waals force and the intermolecular force are appropriately generated.

Figure 7A:
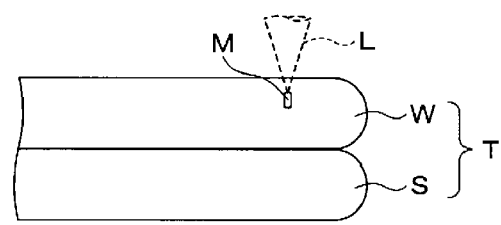
FIG. 7A to FIG. 7C are explanatory diagrams illustrating a processing target wafer in major processes of a wafer processing according to the first exemplary embodiment.

Thereafter, the combined wafer T is transferred into the modification layer forming apparatus 31 by the wafer transfer device 22. The combined wafer T carried into the modification layer forming apparatus 31 is delivered onto and held by the chuck 100. Then, the chuck 100 is moved in the horizontal direction by the moving mechanism 101 to implement centering of the combined wafer T, and a position of the laser head 103 is adjusted such that the laser head 103 is located directly above a preset position of the combined wafer T (processing target wafer W). This preset position is a boundary between a peripheral portion We and a central portion Wc of the processing target wafer W. Afterwards, by irradiating laser light L to the inside of the processing target wafer W from the laser head 103 while rotating the chuck 100 with the rotating mechanism 102, a modification layer M having an annular shape is formed within the processing target wafer W, as depicted in FIG. 7A. Here, a position where the modification layer M is formed is the same as described above with reference to FIG. 4 and FIG. 5.

Figure 7B:
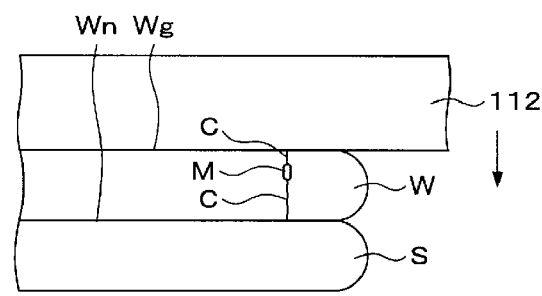

Subsequently, the combined wafer T is transferred into the processing apparatus 32 by the wafer transfer device 22. The combined wafer T carried into the processing apparatus 32 is delivered onto and held by the chuck 111. Then, by respectively rotating the chuck 111 and the grinding whetstone 112 while lowering the grinding whetstone 112 in the state that the processing target wafer W is in contact with a part of the circular arc of the grinding whetstone 112, as illustrated in FIG. 7B, the processing surface Wg of the processing target wafer W is ground.

When the processing surface Wg is ground, cracks C develop, within the processing target wafer W, from the modification layer M in a plate thickness direction and reach a processing surface Wg and the non-processing surface Wn. Since the processing target wafer W has single crystals of silicon, the cracks C develop in a substantially straight line shape. Further, when viewed from the top, the cracks C are formed to have an annular shape. Further, the cracks C may develop when the modification layer M is formed by the modification layer forming apparatus 31. That is, the time when the cracks C are formed may be a time when the processing surface Wg is ground in the processing apparatus 32, or a time when the modification layer M is formed by the modification layer forming apparatus 31.

Figure 7C:
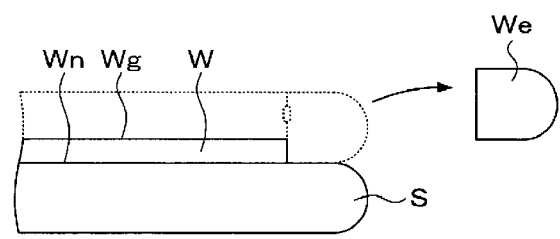

Further, if the grinding of the processing surface Wg progresses, the peripheral portion We of the processing target wafer W comes off and is removed, starting from the modification layer M and the cracks C, as illustrated in FIG. 7C. At this time, since the cracks C develop in the substantially straight line shape as mentioned above, an outer side surface of the processing target wafer W after the removal of the peripheral portion We can be made even with few irregularities. Furthermore, since a lower end of the modification layer M is located above a target surface of the processing target wafer W after being ground as stated above, the modification layer M is removed when the processing surface Wg is ground. The modification layer M is amorphous and has low strength. In the present exemplary embodiment, however, since the modification layer M is not left in the processing target wafer W after being ground, high strength can be obtained.

In the modification layer forming apparatus 31, the peripheral portion We is removed, and the processing surface Wg of the processing target wafer W is ground to a target thickness.

Thereafter, the combined wafer T after being subjected to all the necessary processings is carried into the cassette Ct on the cassette placing table 10 by the wafer transfer device 22. Then, the series of processes of the wafer processing in the substrate processing system 1 are completed.

Now, a modification example of the first exemplary embodiment will be explained. In the above description, the modification layer M is formed within the processing target wafer W by the modification layer forming apparatus 31 after the processing target wafer W and the support wafer S are bonded by the bonding apparatus 30. In the present modification example, this order is reversed.

Figure 8A:
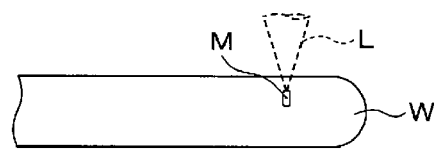
FIG. 8A to FIG. 8D are explanatory diagrams illustrating a processing target wafer in major processes of a wafer processing according to a modification example of the first exemplary embodiment.

That is, in the substrate processing system 1, a processing target wafer W within the cassette Cw is first taken out by the wafer transfer device 22, and transferred into the modification layer forming apparatus 31. In the modification layer forming apparatus 31, a modification layer M is formed at a preset position within the processing target wafer W, as depicted in FIG. 8A.

In parallel with this formation of the modification layer M by the modification layer forming apparatus 31, a support wafer S within the cassette Cs is taken out by the wafer transfer device 22, and transferred into the bonding apparatus 30.

Figure 8B:
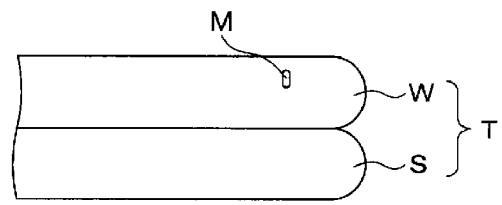

Thereafter, the processing target wafer W is transferred into the bonding apparatus 30 by the wafer transfer device 22. In the bonding apparatus 30, the processing target wafer W and the support wafer S are bonded as shown in FIG. 8B, so that the combined wafer T is formed.

Figure 8C:
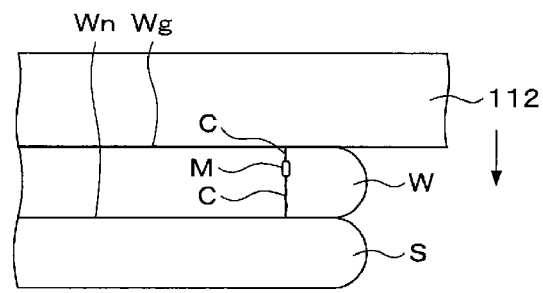
Figure 8D:
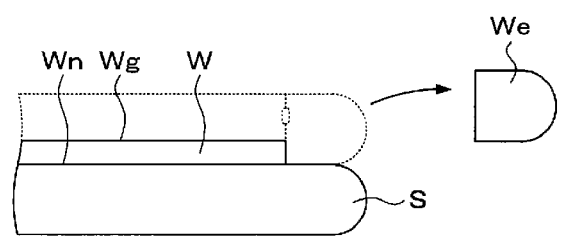

Subsequently, the combined wafer T is transferred into the processing apparatus 32 by the wafer transfer device 22. In the processing apparatus 32, by respectively rotating the chuck 111 and the grinding whetstone 112 while lowering the grinding whetstone 112 in the state that the processing target wafer W is in contact with a part of the circular arc of the grinding whetstone 112, as illustrated in FIG. 8C, a processing surface Wg of the processing target wafer W is ground. Accordingly, a peripheral portion We is removed, and the processing surface Wg of the processing target wafer W is ground to a target thickness, as illustrated in FIG. 8D.

Then, the combined wafer T after being subjected to all the processings required is transferred into the cassette Ct on the cassette placing table 10 by the wafer transfer device 22. Then, the series of processes of the wafer processing in the substrate processing system 1 are completed.

According to the first exemplary embodiment and the modification example as stated above, the following effects can be achieved. The following description will be provided in comparison with a case where a peripheral portion of a processing target wafer is removed by being ground with a wheel (grinding tool) as in the prior art. Further, conventionally, the peripheral portion of the processing target wafer may be removed by using a blade (grinding tool). In this case, however, there are the same problems as faced in the case of using the wheel.

If the peripheral portion of the processing target wafer of a combined wafer is ground and removed with the wheel as in the conventional case, that is, as stated in the aforementioned Patent Document 1 after the processing target wafer and a support wafer are bonded, a vertical movement of the wheel may not be appropriately controlled due to various factors such as a tolerance, and even a surface of the support wafer may be ground.

In contrast, in the present exemplary embodiment, by forming the modification layer M within the processing target wafer W, the peripheral portion We can be removed starting from this modification layer M and the cracks C. In such a case, the bonding surface Sj of the support wafer S is not damaged by the grinding or the like.

If the peripheral portion of the processing target wafer is ground and removed with the wheel as in the prior art before the processing target wafer and the support wafer are bonded, particles may be generated due to the grinding, and these particles may adhere to a device of the processing target wafer.

In contrast, in the present exemplary embodiment, since the peripheral portion We comes off and is removed starting from the cracks C and the modification layer M formed within the processing target wafer W, no particle is generated. Accordingly, as in the modification example shown in FIG. 8A to FIG. 8D, a device on the non-processing surface Wn is not contaminated even when the processing target wafer W is processed before being bonded.

When using the wheel as in the prior art, there is a limit in adjusting a position of the wheel in a horizontal direction, so that non-uniformity of about several micrometers ($\mu$m) may be caused. As a result, a width (trimming width) of the peripheral portion which is ground and removed with the wheel becomes non-uniform as well, resulting in poor processing accuracy.

In contrast, in the present exemplary embodiment, since the modification layer M is formed within the processing target wafer W by using the laser, high accuracy less than, e.g., 1 $\mu$m can be obtained. Therefore, accuracy of a width (trimming width) of the peripheral portion We which is removed starting from the modification layer M is improved.

If the wheel is used as in the prior art, there is a restriction in a rotation speed of a chuck which holds the processing target wafer when the wheel is lowered to grind the peripheral portion. Thus, it takes time to remove the peripheral portion.

In contrast, in the present exemplary embodiment, since the modification layer M is formed within the processing target wafer W by using the high-frequency laser, a rotation speed of the chuck 100 can be increased, so that the processing can be performed in a very short time. Therefore, a throughput of the wafer processing can be bettered.

If the wheel is used as in the prior art, since the wheel is worn out, the wheel needs to be replaced on a regular basis. Further, since grinding water is used in the grinding using the wheel, disposing of waste water is also required. Thus, a running cost is increased.

In the present exemplary embodiment, however, since the laser head 103 itself is not degraded with a lapse of time, a frequency of maintenance can be reduced. Further, since the dry process using the laser is performed, use of grinding water and disposal of waste water are not needed. Therefore, a running cost can be reduced.

Further, the processing target wafer W, which is a semiconductor wafer, is provided with a notch to indicate a direction of crystal orientation. If, however, the peripheral portion We is removed only with the blade as in the conventional case, it has been difficult to allow the notch to maintain a shape of it.

In contrast, in the present exemplary embodiment, since operations of the processing target wafer W and the laser light are controlled relatively in the modification layer forming apparatus 31, for example, the modification layer M can be formed to conform to the shape of the notch. Thus, the peripheral portion We can be removed easily while the shape of the notch is allowed to remain as it was.

Furthermore, in the above-described exemplary embodiment, as a way to remove the peripheral portion We efficiently when the processing surface Wg is ground, the grinding whetstone 112 may be rotated in a direction from an outside of the processing target wafer W toward an inside thereof with respect to the processing target wafer W being rotated, or may be rotated in a direction from the inside of the processing target wafer W toward the outside thereof with respect to the processing target wafer W being rotated. In this way, the rotation direction of the grinding whetstone 112 can be changed depending on a kind of the processing target wafer W and a process involved.

Moreover, when the processing surface Wg is ground, by aiming high-pressure water to the peripheral portion We from the inside of the processing target wafer W toward the outside thereof, the peripheral portion We may be efficiently removed (blown off).

In addition, in the above-described modification example of the first exemplary embodiment, the formation of the modification layer M in the modification layer forming apparatus 31, the bonding of the processing target wafer W and the support wafer S in the bonding apparatus 30 and the removal of the peripheral portion We in the processing apparatus 32 are performed in this sequence. However, the order of the bonding of the wafers and the removal of the peripheral portion We may be reversed. That is, the formation of the modification layer M in the modification layer forming apparatus 31, the removal of the peripheral portion We in the processing apparatus 32 and the bonding of the processing target wafer W and the support wafer S in the bonding apparatus 30 may be performed in this sequence.

Figure 9:
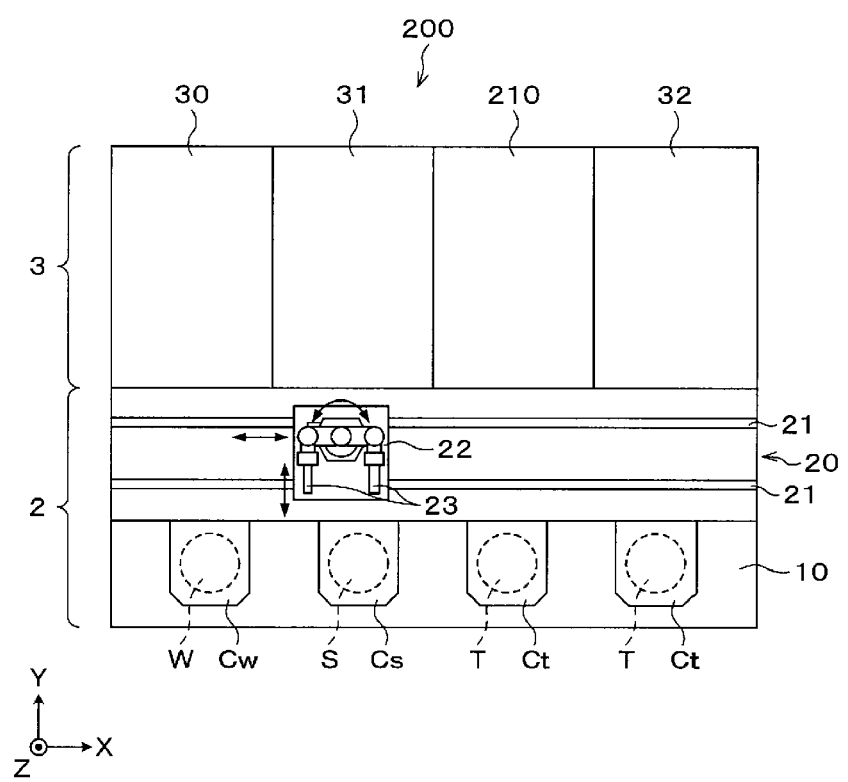
FIG. 9 is a plan view schematically illustrating a configuration of a substrate processing system according to a second exemplary embodiment.

Now, a second exemplary embodiment of the present disclosure will be discussed. FIG. 9 is a plan view schematically illustrating a configuration of a substrate processing system 200 according to the second exemplary embodiment. The substrate processing system 200 further includes a periphery removing apparatus 210 for removing the peripheral portion We of the processing target wafer W in the processing station 3 of the substrate processing system 1 according to the first exemplary embodiment. For example, the periphery removing apparatus 210 is disposed between the modification layer forming apparatus 31 and the processing apparatus 32.

The periphery removing apparatus 210 is configured to remove the peripheral portion We by applying a force to a portion of the processing target wafer W at an outer side than the modification layer M after the modification layer M is formed in the processing target wafer W by the modification layer forming apparatus 31. That is, in the first exemplary embodiment, the peripheral portion We is removed through the grinding of the processing surface Wg of the processing target wafer W performed by the processing apparatus 32. In the second exemplary embodiment, however, the removal of this peripheral portion We is performed by the periphery removing apparatus 210.

Figure 10:
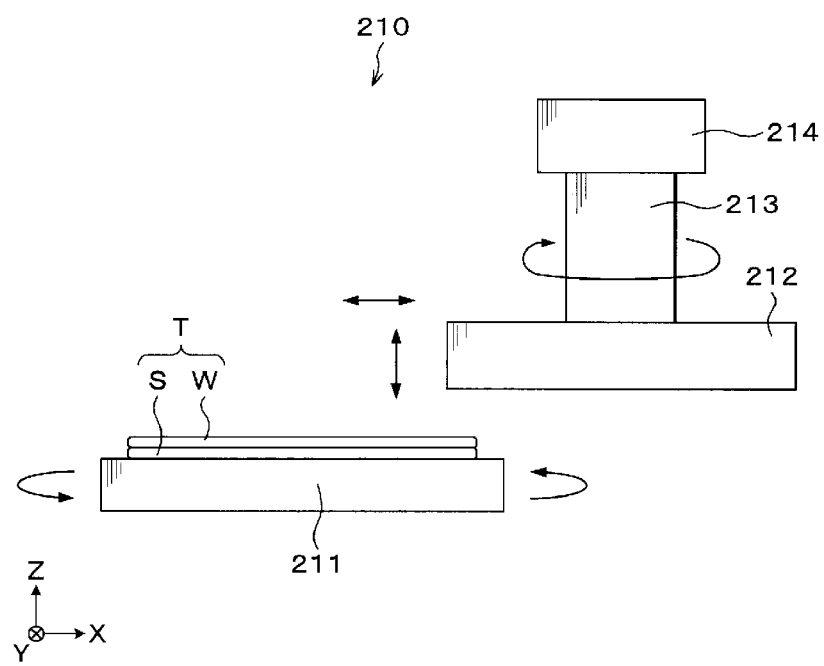
FIG. 10 is a side view illustrating a schematic configuration of a periphery removing apparatus.

As depicted in FIG. 10, the periphery removing apparatus 210 is equipped with a chuck 211 configured to hold the combined wafer T in the state that the processing target wafer W is placed at an upper side and the support wafer S is placed at a lower side. The chuck 211 is configured to be rotatable around a vertical axis by a rotating mechanism (not shown).

An annular whetstone wheel 212 is provided above the chuck 211. The whetstone wheel 212 is provided with a driver 214 via a spindle 213. The driver 214 has, for example, a motor (not shown) embedded therein, and rotates the whetstone wheel 212 and moves it in the vertical direction and a horizontal direction. Further, in the present exemplary embodiment, though the whetstone wheel 212 is used, the exemplary embodiment is not limited thereto, and a blade, for example, may be used instead.

In the periphery removing apparatus 210, by respectively rotating the chuck 211 and the whetstone wheel 212 in the state that the peripheral portion We of the processing target wafer W held by the chuck 211 is in contact with a part of a circular arc of the whetstone wheel 212, an impact is applied to the peripheral portion We. Due to this impact, the peripheral portion We is removed. In this case, by the formation of the modification layer M, accuracy of a removed surface of the processing target wafer W can be improved.

Now, a wafer processing performed by using the substrate processing system 200 having the above-described configuration will be explained. Detailed description on the same processings as those described in the first exemplary embodiment will be omitted.

Figure 11A:
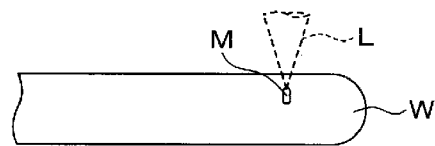
FIG. 11A to FIG. 11E are explanatory diagrams illustrating a processing target wafer in major processes of a wafer processing according to the second exemplary embodiment.

First, a processing target wafer W is taken out of the cassette Cw by the wafer transfer device 22, and transferred into the modification layer forming apparatus 31. In the modification layer forming apparatus 31, a modification layer M is formed at a preset position within the processing target wafer W, as shown in FIG. 11A.

In parallel with the formation of the modification layer M by the modification layer forming apparatus 31, a support wafer S is taken out of the cassette Cs by the wafer transfer device 22, and transferred into the bonding apparatus 30.

Figure 11B:
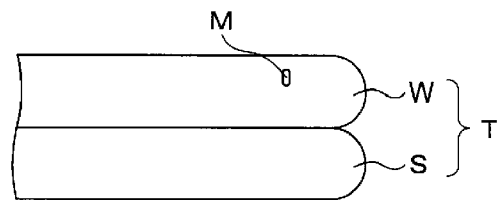

Then, the processing target wafer W is transferred into the bonding apparatus 30 by the wafer transfer device 22. In the bonding apparatus 30, the processing target wafer W and the support wafer S are bonded as shown in FIG. 11B, so that a combined wafer T is formed.

Figure 11C:
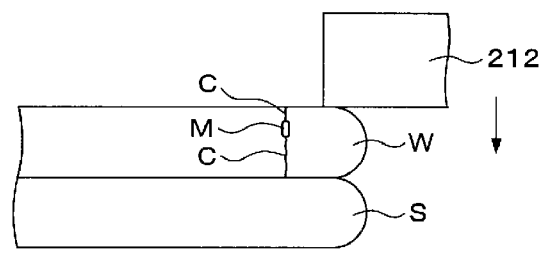
Figure 11D:
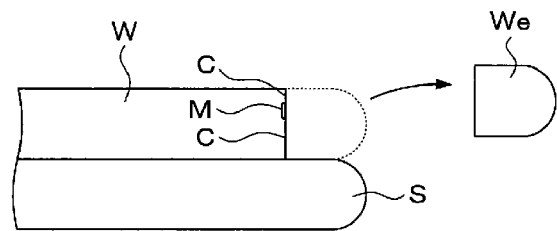

Subsequently, the combined wafer T is transferred into the periphery removing apparatus 210 by the wafer transfer device 22. In the periphery removing apparatus 210, a part of the circular arc of the whetstone wheel 212 is brought into contact with a portion of the processing target wafer W outer than the modification layer M, as shown in FIG. 11C. In this state, if the chuck 211 and the whetstone wheel 212 are respectively rotated while the whetstone wheel 212 is lowered, an impact is applied to a peripheral portion We of the processing target wafer W. Due to this impact, the peripheral portion We comes off and is removed, staring from the modification layer M and cracks C, as illustrated in FIG. 11D.

Figure 11E:
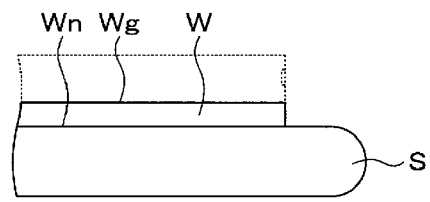

Next, the combined wafer T is transferred into the processing apparatus 32 by the wafer transfer device 22. In the processing apparatus 32, a processing surface Wg of the processing target wafer W is ground to a target thickness, as depicted in FIG. 11E.

Thereafter, the combined wafer T after being subjected to all the processings required is transferred into the cassette Ct on the cassette placing table 10 by the wafer transfer device 22. Then, the series of processes of the wafer processing in the substrate processing system 200 is completed.

In the above-described second exemplary embodiment, the same effects as obtained in the first exemplary embodiment can be achieved.

Further, in the example shown in FIG. 11A to FIG. 11E in the second exemplary embodiment, the formation of the modification layer M, the bonding of the processing target wafer W and the support wafer S, the removal of the peripheral portion We, and the grinding of the processing surface Wg of the processing target wafer W are performed in this sequence. However, the order of the formation of the modification layer M and the bonding of the processing target wafer W and the support wafer S may be reversed. That is, the bonding of the processing target wafer W and the support wafer S, the formation of the modification layer M, the removal of the peripheral portion We, and the grinding of the processing surface Wg of the processing target wafer W may be carried out in this sequence.

In the above-described exemplary embodiments, a single sheet of the processing target wafer W is bonded to the support wafer S. However, semiconductor wafers having devices formed thereon may be bonded to each other, or multiple processing target wafers W having devices formed thereon may be stacked on top of each other. The following description will be provided for a case where the multiple processing target wafers W having the devices formed thereon are stacked on top of each other by using the substrate processing system 1 according to the first exemplary embodiment.

Figure 12A:
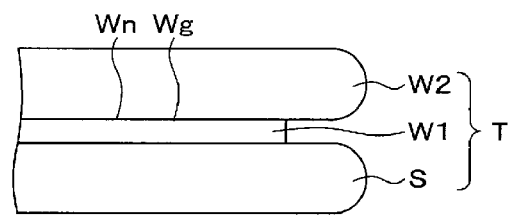
FIG. 12A to FIG. 12D are explanatory diagrams illustrating a processing target wafer in major processes of a wafer processing according to another exemplary embodiment.

In the combined wafer T after being subjected to the wafer processing of the first exemplary embodiment, the processing target wafer W is free of its peripheral portion We, and the processing surface Wg has the target thickness as a result of being subjected to the grinding, as shown in FIG. 12A. In the following description, this first sheet of processing target wafer W will be referred to as "first processing target wafer W1."

This combined wafer T is transferred into the bonding apparatus 30 by the wafer transfer device 22. Further, a processing target wafer W as a third substrate to be stacked next is also transferred into the bonding apparatus 30 by the wafer transfer device 22. In the following description, this second sheet of processing target wafer W will be referred to as "second processing target wafer W2." In the bonding apparatus 30, the processing surface Wg of the first processing target wafer W1 and a non-processing surface Wn of the second processing target wafer W2 are bonded, as illustrated in FIG. 12A, so that a combined wafer T is obtained.

Figure 12B:
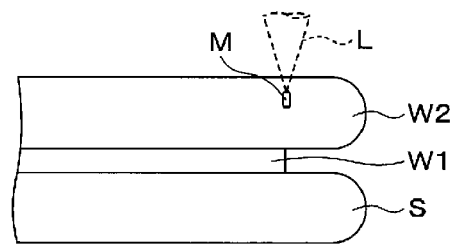

Subsequently, the combined wafer T is transferred into the modification layer forming apparatus 31 by the wafer transfer device 22. In the modification layer forming apparatus 31, a modification layer M is formed at a preset position within the second processing target wafer W2, as illustrated in FIG. 12B.

Figure 12C:
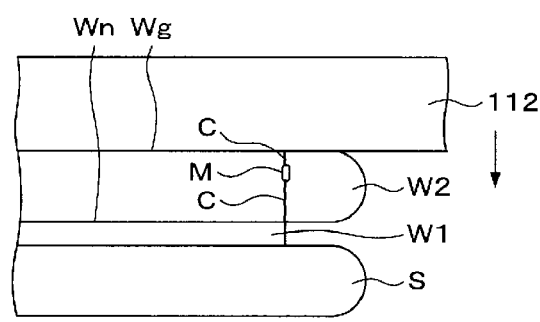
Figure 12D:
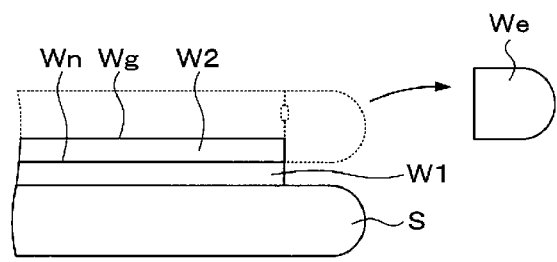

Then, the combined wafer T is transferred into the processing apparatus 32 by the wafer transfer device 22. In the processing apparatus 32, by respectively rotating the chuck 111 and the grinding whetstone 112 while lowering the grinding whetstone 112 in the state that the second processing target wafer W2 and a part of the circular arc of the grinding whetstone 112 are in contact with each other, as shown in FIG. 12C, a processing surface Wg of the second processing target wafer W2 is ground. Accordingly, as depicted in FIG. 12D, a peripheral portion We of the second processing target wafer W2 is removed, and the processing surface Wg thereof is ground to a target thickness.

Afterwards, the combined wafer T after being subjected to all the processings required is transferred into the cassette Ct on the cassette placing table 10 by the wafer transfer device 22. Then, the series of processes of the wafer processing in the substrate processing system 1 are completed.

As for the combined wafer T shown in FIG. 12A, if the peripheral portion We of the second processing target wafer W2 is removed by using a wheel as in the prior art, this peripheral portion We is difficult to grind as there is a hollow space under the non-processing surface Wn of the second processing target wafer W2.

In contrast, in the present exemplary embodiment, by forming the modification layer M within the second processing target wafer W2, the peripheral portion We can be removed easily starting from the modification layer M and cracks C.

Further, in case of using a wheel or a blade as in the prior art, there is a limit in adjusting a position of the wheel or blade in a horizontal direction, so that non-uniformity of about several micrometers (μm) may be caused. As a result, a width (trimming width) of the peripheral portion which is ground and removed with the wheel or blade becomes non-uniform as well. Particularly, if the processing target wafers are stacked, this non-uniformity is added. As a result, a processing target wafer at an upper level may stick out of a processing target wafer at a lower level.

In the present exemplary embodiment, however, since the modification layer M is formed within the second processing target wafer W2 by using laser, high level of accuracy can be obtained, so that the processing target wafers W can be stacked appropriately.

Figure 13A:
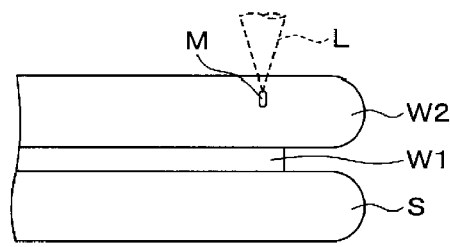
FIG. 13A and FIG. 13B are explanatory diagrams illustrating a processing target wafer in major processes of a wafer processing according to still another exemplary embodiment.
Figure 13B:
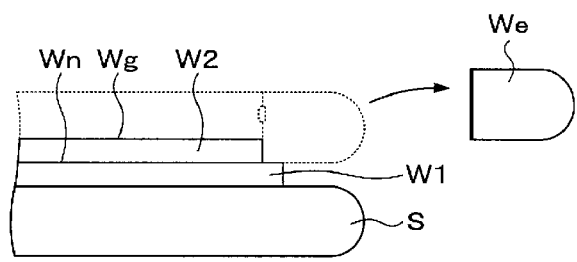

Furthermore, when the multiple processing target wafers W are stacked on top of each other as in the present exemplary embodiment, the peripheral portion We to be removed from the second processing target wafer W2 at the upper side may be set to be an inner side than the peripheral portion We removed from the first processing target wafer W1 at the lower side. That is, as depicted in FIG. 13A, the modification layer M within the second processing target wafer W2 may be formed at an inner side than an end portion of the first processing target wafer W1 in a diametrical direction. In such a case, a diameter of the second processing target wafer W2 stacked on the top becomes smaller than a diameter of the first processing target wafer W1, as illustrated in FIG. 13B. Accordingly, sticking of the second processing target wafer W2 out of the first processing target wafer W1 can be certainly suppressed.

In the modification layer forming apparatus 31 according to the above-described exemplary embodiments, the modification layer M is formed at a single position such that a lower end thereof is located above a target surface of the processing target wafer W after being ground, as depicted in FIG. 4. However, the way how to form the modification layer M is not limited thereto.

As depicted in FIG. 14A to FIG. 14D, a multiple number of modification layers M may be formed in a thickness direction of the processing target wafer W. In FIG. 14A to FIG. 14D, a device layer and oxide films formed at an interface between the processing target wafer W and the support wafer S of the combined wafer T are illustrated. That is, a device layer D in which a multiple number of devices is formed is formed on the non-processing surface Wn of the processing target wafer W, and an oxide film Fw (for example, a SiO₂ film) is formed on the device layer D. Further, an oxide film Fs is formed on the bonding surface Sj of the support wafer S. In case that the support wafer S has multiple devices formed on the bonding surface Sj thereof, a device layer (not shown) is formed on the bonding surface Sj, the same as in the processing target wafer W.

Figure 14A:
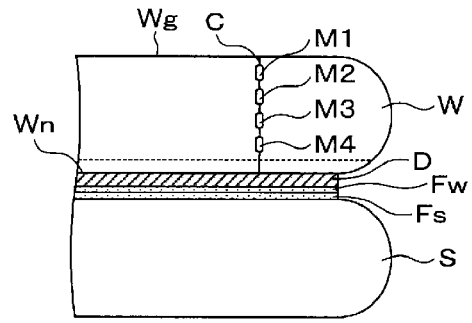
FIG. 14A to FIG. 14D are longitudinal cross sectional views illustrating states in which modification layers are formed in a processing target wafer according to various other exemplary embodiments.

In an example shown in FIG. 14A, modification layers M1 to M4 are formed in multiple levels, for example, in four levels in the thickness direction of the processing target wafer W. A lower end of the lowermost modification layer M4 is located above a target surface (indicated by a dashed line in FIG. 14A) of the processing target wafer W after being ground. Further, a crack C which develops due to these modification layers M1 to M4 reaches the processing surface Wg and the non-processing surface Wn of the processing target wafer W.

Figure 14B:
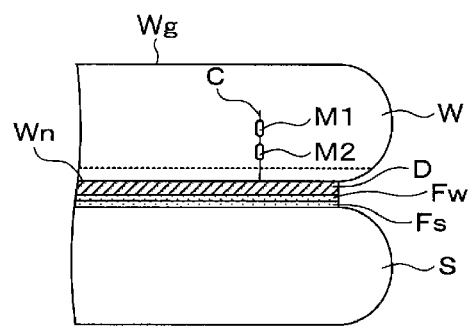

In an example shown in FIG. 14B, modification layers M1 and M2 are formed in multiple levels, for example, in two levels in the thickness direction of the processing target wafer W. A lower end of the modification layer M2 at a lower level is located above a target surface (indicated by a dashed line in FIG. 14B) of the processing target wafer W after being ground. Further, a crack C which develops due to these modification layers M1 and M2 reaches the non-processing surface Wn of the processing target wafer W but does not reach the processing surface Wg. In this case, when the processing surface Wg is ground by lowering the grinding whetstone 112 in the processing apparatus 32, for example, the processing surface Wg including the peripheral portion We of the processing target wafer W is ground until a grinding surface of the grinding whetstone 112 reaches the crack C. If the grinding surface of the grinding whetstone 112 reaches the crack C, the peripheral portion We under this crack C comes off and is removed. In this way, by controlling a height of an upper end of the crack C which extends from the modification layers M1 and M2 to a preset position, a size (height) of a small piece of the peripheral portion We to be removed can be controlled.

Figure 14C:
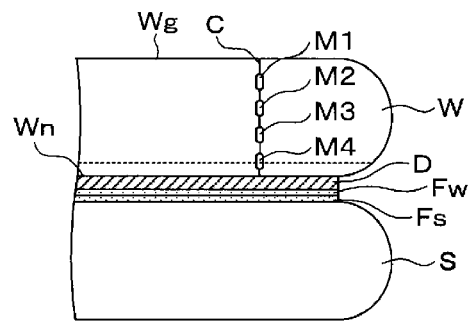

In an example shown in FIG. 14C, modification layers M1 to M4 are formed in multiple levels, for example, in four levels in the thickness direction of the processing target wafer W. A lower end of the lowermost modification layer M4 is located under a target surface (indicated by a dashed line in FIG. 14C) of the processing target wafer W after being ground. Further, a crack C which develops due to these modification layers M1 to M4 reaches the processing surface Wg and the non-processing surface Wn of the processing target wafer W. In this case, since the modification layer M4 is formed at a boundary between the peripheral portion We and a central portion Wc of the processing target wafer W after being ground, the peripheral portion We can be removed more securely. Further, if the modification layer M4 is formed under the target surface as mentioned above, concentration of laser light is controlled to be blurred so that a crack C extending from the modification layer M4 is difficult to form. Accordingly, the crack C can be suppressed from reaching the support wafer S bonded to the processing target wafer W. Although a position of the crack C changes in the entire circumferential direction, the peripheral portion We can be removed accurately as the lower end of the modification layer M4 is adjustable.

Figure 14D:
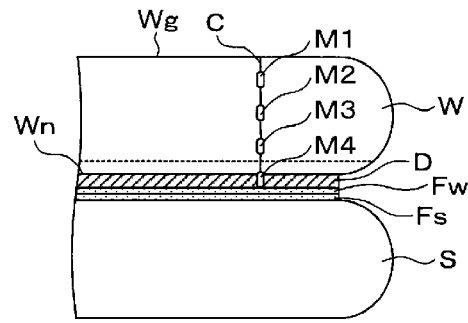

In an example shown in FIG. 14D, modification layers M1 to M4 are formed in multiple levels, for example, in four levels in the thickness direction of the processing target wafer W. A lower end of the lowermost modification layer M4 is located within the device layer D. Further, a crack C which develops due to these modification layers M1 to M4 reaches the processing surface Wg of the processing target wafer W. In this case as well, since the modification layer M4 is formed at a boundary between the peripheral portion We and the central portion Wc of the processing target wafer W after being ground, the peripheral portion We can be removed more securely.

Figure 15A:
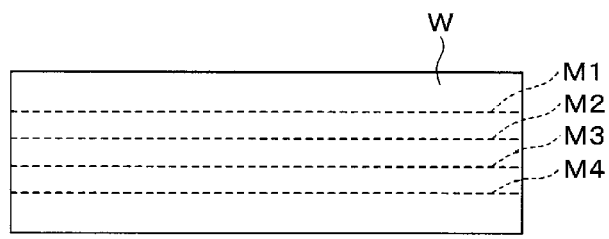
FIG. 15A to FIG. 15C are explanatory diagrams illustrating states in which modification layers are formed in a processing target wafer according to various other exemplary embodiments.
Figure 15B:
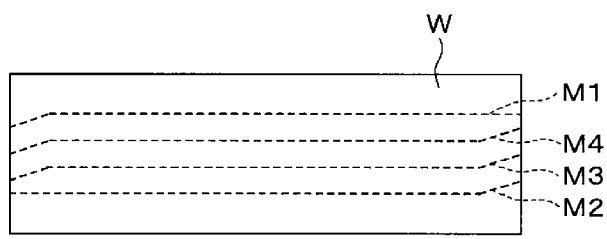
Figure 15C:
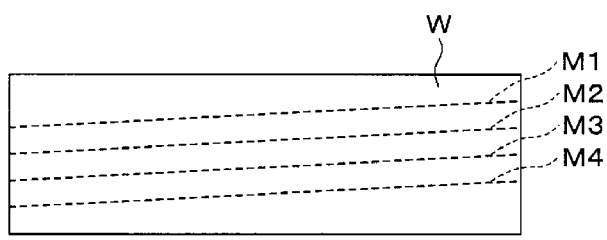

As depicted in FIG. 14A to FIG. 14D, the multiple modification layers M may be formed in the thickness direction of the processing target wafer W in the various ways. However, three processing methods may be adopted to form these multiple modification layers M, as shown in FIG. 15A to FIG. 15C, for example. Each of FIG. 15A to FIG. 15C presents a development view of a portion (the boundary between the peripheral portion We and the central portion Wc) of the processing target wafer W where the modification layers M are formed. A horizontal direction of each of FIG. 15A to FIG. 15C represents a circumferential direction of the boundary between the peripheral portion We and the central portion Wc, and a vertical direction indicates the thickness direction of the processing target wafer W. Further, dashed lines in FIG. 15A to FIG. 15C indicate modification layers M1 to M4, illustrating a state in which the multiple modification layers M1 to M4 are formed in the thickness direction of the processing target wafer W.

In a processing method shown in FIG. 15A, in the modification layer forming apparatus 31, the modification layer M4 having an annular shape is formed by irradiating laser light to the inside of the processing target wafer W from the laser head 103 fixed in the vertical direction while rotating the chuck 100 with the rotating mechanism 102. Then, the rotation of the chuck 100 is stopped, and the irradiation of the laser light from the laser head 103 is stopped. Thereafter, the laser head 103 is raised by the elevating mechanism 105 to a preset position, that is, a position where the modification layer M3 is to be formed. Then, by irradiating the laser light from the laser head 103 while rotating the chuck 100, the modification layer M3 having an annular shape is formed. The modification layers M2 and M1 are formed in the same manner, so that the processing target wafer W has the modification layers M1 to M4 formed therein.

Further, in the formation of the modification layers M1 to M4, the irradiation of the laser light from the laser head 103 may be turned on and off while carrying on the rotation of the chuck 100. By way of example, the modification layer M4 is formed by irradiating the laser light to the inside of the processing target wafer W from the laser head 103 while rotating the chuck 100. Then, while carrying on the rotation of the chuck 100, the irradiation of the laser light from the laser head 103 is temporarily stopped. Thereafter, the laser head 103 is raised, and by irradiating the laser light to the inside of the processing target wafer W from the laser head 103 again, the modification layer M3 is formed. At this time, by storing an irradiation start position and an irradiation end position for the laser light at a time when the modification layer M4 is formed, an irradiation start position and an irradiation end position for the laser light when the modification layer M3 is formed subsequently can be adjusted. Further, since the rotation of the chuck 100 is not stopped as stated above, an irradiation standby time for the laser light during acceleration and deceleration of the rotation of the chuck 100 can be reduced, so that a total processing time can be shortened. Furthermore, since the laser processing can be carried out uniformly by maintaining a rotation speed of the chuck 100 constant, a pitch of the modification layers M in the horizontal direction can be uniformed.

In a processing method shown in FIG. 15B, the modification layer M4 having an annular shape is formed by irradiating the laser light to the inside of the processing target wafer W from the laser head 103 fixed in the vertical direction while rotating the chuck 100 with the rotating mechanism 102. Before the formation of this modification layer M4 is ended, the laser head 103 is raised by the elevating mechanism 105 to a preset position, that is, a position where the modification layer M3 is to be formed, in the state that the rotation of the chuck 100 and the irradiation of the laser light from the laser head 103 are continued. Thereafter, by irradiating the laser light from the laser head 103 while rotating the chuck 100 in the state that the position of the laser head 103 in the vertical direction is fixed, the modification layer M3 having an annular shape is formed. The modification layers M2 and M1 are formed in the same manner, so that the processing target wafer W has the modification layers M1 to M4 formed therein. In this case, since the modification layers M1 to M4 can be formed consecutively, a time required to perform the processing can be shortened, as compared to the processing method described in FIG. 15A.

In a processing method shown in FIG. 15C, the modification layers M1 to M4 having annular shapes are continuously formed by irradiating the laser light to the inside of the processing target wafer W from the laser head 103 while rotating the chuck 100 by the rotating mechanism 102 and raising the laser head 103 by the elevating mechanism 105. That is, in this processing method, the modification layers M1 to M4 are continuously formed in the spiral shape. Even in this case, since the modification layers M1 to M4 can be continuously formed, a time required for the processing can be shortened as compared to the processing method shown in FIG. 15A. Further, since the modification layers M1 to M4 are formed not to have a large gradient when viewed from the side, they can be formed uniformly in a vertical direction (in the thickness direction of the processing target wafer W), as compared to the processing method shown in FIG. 15B.

Figure 16:
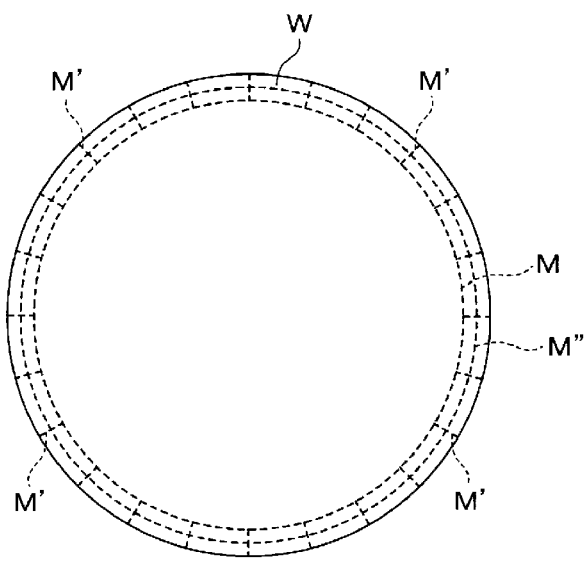
FIG. 16 is a plan view illustrating a state in which modification layers are formed in a processing target wafer according to another exemplary embodiment.

In the above-described exemplary embodiments, the annular modification layer M is formed within the processing target wafer W in the modification layer forming apparatus 31. As depicted in FIG. 16, however, multiple diametrical modification layers M' extending outwards from the annular modification layer M in the diametrical direction may be further formed. In this case, when the peripheral portion We is removed by the processing apparatus 32, for example, this peripheral portion We is split into multiple pieces by the diametrical modification layers M' while being peeled off, starting from the annular modification layer M. Accordingly, the size of the peripheral portion We to be removed is reduced, so that the peripheral portion We can be removed more easily.

Furthermore, as a way to make smaller the peripheral portion We (edge piece) which is removed when the processing surface Wg is ground, multiple annular split modification layers M" may be formed at a regular distance therebetween to be concentric with the modification layer M, as depicted in FIG. 16. In this case, the peripheral portion We to be removed can be made smaller. Furthermore, by controlling the distance between the split modification layers M" in the diametrical direction, a size of a small piece of the peripheral portion We to be removed can be adjusted.

Figure 17:
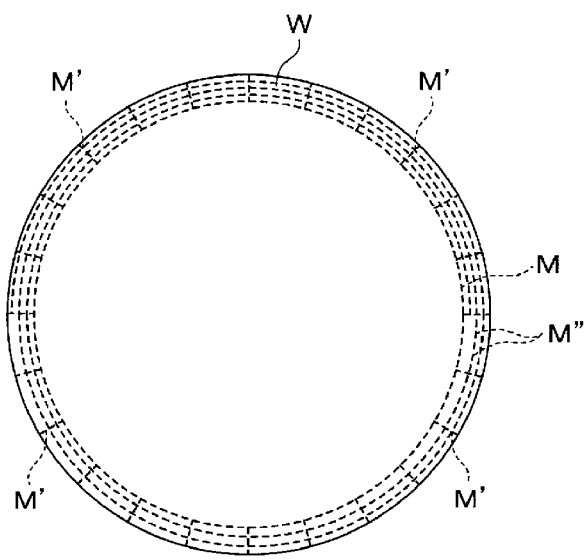
FIG. 17 is a plan view illustrating a state in which modification layers are formed in a processing target wafer according to still another exemplary embodiment.

Moreover, when the multiple annular split modification layers M" are formed as stated above, the split modification layers M" may be formed to have a spiral shape when viewed from the top, as illustrated in FIG. 17. In this case, in the modification layer forming apparatus 31, by irradiating the laser light to the processing target wafer W from the laser head 103 while rotating the chuck 100 and moving the chuck 100 or the laser head 103 in the horizontal direction, the split modification layers M" in the spiral shape can be continuously formed. As a result, a time required for the processing can be reduced.

Figure 18:
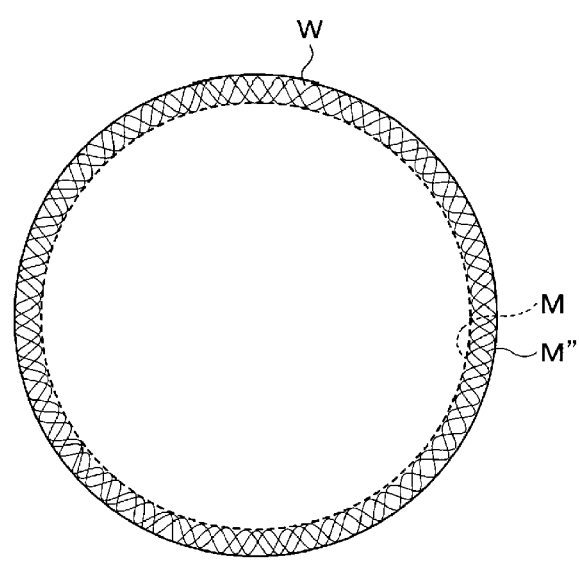
FIG. 18 is a plan view illustrating a state in which modification layers are formed in a processing target wafer according to yet another exemplary embodiment.

In addition, as illustrated in FIG. 18, the split modification layer M" may be formed to have the spiral shape in a zigzag pattern. In this case, in the modification layer forming apparatus 31, the laser light is irradiated to the processing target wafer W from the laser head 103 while the chuck 100 or the laser head 103 is moved in the horizontal direction and the chuck 100 is rotated. At this time, by controlling a phase, a frequency and an amplitude of the movement of the chuck 100 or the laser head 103, this split modification layer M" in the zigzag waveform pattern can be formed. Further, the split modification layer M" may be formed to go two or more rounds. By controlling a deviation of the zigzag phase or the number of the rounds of the split modification layer M", the size of the small piece of the peripheral portion We to be removed can be controlled. Furthermore, in the present exemplary embodiment, the diametrical modification layers M' shown in FIG. 16 and FIG. 17 are unnecessary.

Moreover, as depicted in FIG. 19A, the split modification layers M" may be formed such that a crack C developing from the split modification layers M" extends to a preset position within the processing target wafer W. That is, the crack C reaches the non-processing surface Wn of the processing target wafer W but does not reach the processing surface Wg thereof. In this case, when the processing surface Wg is ground by lowering the grinding whetstone 112 in the processing apparatus 32, for example, the processing surface Wg including the peripheral portion We of the processing target wafer W is ground until the grinding surface of the grinding whetstone 112 reaches the crack C, as illustrated in FIG. 199. If the grinding surface of the grinding whetstone 112 reaches the crack C, the peripheral portion We under this crack C comes off and is thus removed. In this way, by controlling a height of an upper end of the crack C to a preset position, a size (height) of a small piece of the peripheral portion We to be removed can be controlled. Furthermore, in the example of FIG. 19A and FIG. 19B, though the split modification layers M" are formed in two levels, these two levels of split modification layers M" can be formed at the same time while rotating the chuck 100, by setting two condensing points from the laser head 103.

In the above-described exemplary embodiments, as a way to remove the peripheral portion We efficiently, the following method may be adopted. That is, before the processing target wafer W and the support wafer S are bonded in the bonding apparatus 30, for example, by reducing a bonding force at a portion of the interface between the support wafer S and the processing target wafer W corresponding to the peripheral portion We to be removed, the peripheral portion We can be removed efficiently. As a specific way to reduce this bonding force, the following methods may be considered.

A first method of reducing the bonding force is, for example, to roughen a portion of the non-processing surface Wn of the processing target wafer W corresponding to the peripheral portion We to be removed by irradiating laser light or the like thereto. To elaborate, an interface processing apparatus 300 shown in FIG. 20 is used. This interface processing apparatus 300 is provided at a proper position within, for example, the processing station 3 of the substrate processing system 1.

The interface processing apparatus 300 is equipped with a chuck 301 configured to hold the processing target wafer W with the non-processing surface Wn thereof facing upwards. The chuck 301 is configured to be movable in the X-axis direction and Y-axis direction by a moving mechanism 302. The moving mechanism 302 is implemented by a general precise XY-stage. Further, the chuck 301 is configured to be rotatable around a vertical axis by a rotating mechanism 303.

A laser head 304 configured to irradiate laser light K to the non-processing surface Wn at the peripheral portion We of the processing target wafer W is disposed above the chuck 301. The laser light K emitted from the laser head 304 may be of any kind. By way of non-limiting example, excimer laser or fiber laser may be used. As stated above, the device layer D and the oxide layer Fw are formed on the non-processing surface Wn. The laser light needs to have a wavelength of, e.g., 266 nm which is absorbed into the oxide film Fw. Further, the laser head 304 is configured to be movable in the X-axis direction, the Y-axis direction and the Z-axis direction by a moving mechanism (not shown).

An irradiation port of the laser head 304 for the laser light K is configured to be movable in a horizontal direction by a moving mechanism (not shown). By way of example, the moving mechanism may move the irradiation port of the laser head 304 mechanically or move the irradiation port with an acoustic device. Since the laser light K is absorbed into the oxide film Fw, a condensing point thereof need not be controlled precisely. For the reason, by moving the irradiation port of the laser head 304 with the moving mechanism as in the present exemplary embodiment, the non-processing surface Wn (oxide film Fw) at the peripheral portion We can be modified and roughened.

A gas supply 305 configured to supply a gas to the processing target wafer W is provided above the chuck 301. The gas supplied from the gas supply 305 may be, by way of example, but not limitation, clean air or an inert gas such as a nitrogen gas. The gas supply 305 is equipped with a nozzle 306 configured to supply the gas; and a rectifying plate 307 configured to rectify the gas supplied from the nozzle 306. The nozzle 306 communicates with a gas source (not shown) configured to store and supply the gas. A gas supply port of the nozzle 306 is formed above a center of the processing target wafer W. The rectifying plate 307 is disposed substantially in parallel with the processing target wafer W held on the chuck 301, and controls the gas from the nozzle 306 to flow on the non-processing surface Wn of the processing target wafer W.

A cup 308 for collecting and exhausting the gas from the gas supply 305 is disposed around the chuck 301. An exhaust pipe 309 through which the gas is exhausted is connected to a bottom surface of the cup 308. Further, the cup 308 may be configured to cover the entire circumference of the processing target wafer W or locally cover only the vicinity of the laser head 304.

In the interface processing apparatus 300, after the processing target wafer W is first held by the chuck 301, the chuck 301 is moved in the horizontal direction by the moving mechanism 302 to thereby perform centering of the processing target wafer W. Then, by irradiating the laser light K to the non-processing surface Wn at the peripheral portion We of the processing target wafer W from the laser head 304 while rotating the chuck 301 by the rotating mechanism 303, the corresponding non-processing surface Wn is roughened.

Further, when roughening the non-processing surface Wn of the processing target wafer W, the gas is supplied to the non-processing surface Wn from the gas supply 305. The supplied gas flows on the entire non-processing surface Wn and is exhausted through the exhaust pipe 309. When modifying the non-processing surface Wn at the peripheral portion We by using the laser light as in the present exemplary embodiment, a particle (dust) may be generated. If the particle adheres to the non-processing surface Wn at the central portion Wc, the devices may be damaged. Thus, by supplying the gas from the gas supply 305 and performing purging, the adhesion of the particle to the non-processing surface Wn can be suppressed. Further, the non-processing surface Wn may be cleaned in another cleaning apparatus (not shown) after the interface processing in the interface processing apparatus 300. In this case, as compared to a case where there is not provided the configuration in which the gas is supplied to a gap between the rectifying plate 307 and the processing target wafer W as in the interface processing apparatus 300, for example, since cleaning is performed by the interface processing apparatus 300 in the present exemplary embodiment, cleaning in another cleaning apparatus can be minimized.

Figure 21:
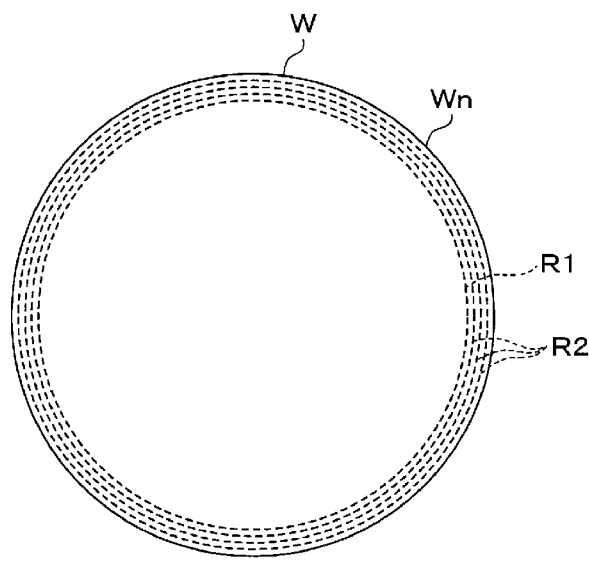
FIG. 21 is a plan view illustrating a state in which modification grooves are formed in a processing target wafer according to another exemplary embodiment.
Figure 22:
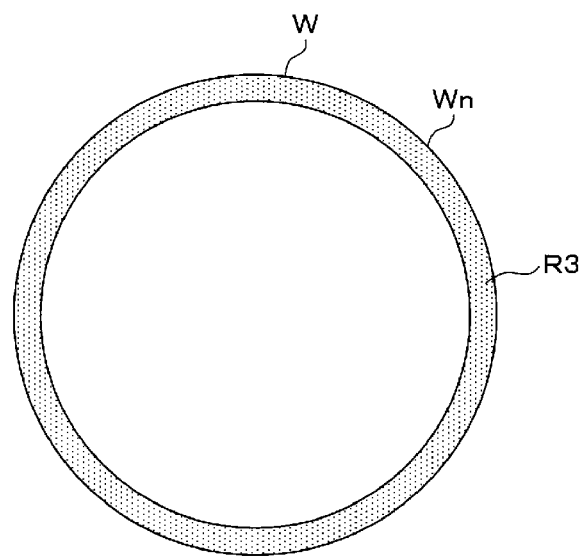
FIG. 22 is a plan view illustrating a state in which a modification surface is formed in a processing target wafer according to still another exemplary embodiment.

At the position where the non-processing surface Wn is roughened, a modification groove R1 serving as a bonding force reduced portion configured to reduce the bonding force may be formed by, for example, modifying an interface between the portion of the non-processing surface Wn of the processing target wafer W corresponding to the peripheral portion We supposed to be removed and a portion of the non-processing surface Wn of the processing target wafer W corresponding to the central portion Wc supposed not to be removed, as illustrated in FIG. 21. Further, multiple annular modification grooves R2 may be formed at an outside of the modification groove R1. Alternatively, by modifying the portion corresponding to the peripheral portion We into a surface shape, a roughened modification surface R3 may be formed, as shown in FIG. 22. In such a case, the modification surface R3 may be formed of the multiple modification grooves R2, or the modification surface R3 may be formed by adjusting a laser light irradiation range.

Now, a wafer processing performed by using the substrate processing system 1 equipped with the above-described interface processing apparatus 300 will be explained. In the present exemplary embodiment, detailed description on the same processings as those described in the first exemplary embodiment will be omitted.

Figure 23A:
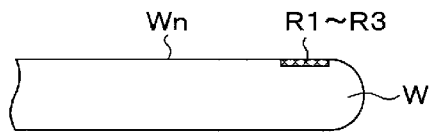
FIG. 23A to FIG. 23E are explanatory diagrams illustrating a processing target wafer in major processes of a wafer processing according to yet another exemplary embodiment.

First, a processing target wafer W is taken out of the cassette Cw by the wafer transfer device 22, and transferred into the interface processing apparatus 300. In the interface processing apparatus 300, a non-processing surface Wn (oxide film Fw) at a peripheral portion We of the processing target wafer W is modified, so that either roughened modification grooves R1 and R2 or a roughened modification surface R3 is formed, as illustrated in FIG. 23A.

Further, in parallel with this roughening of the non-processing surface Wn by the interface processing apparatus 300, a support wafer S is taken out of the cassette Cs by the wafer transfer device 22, and transferred into the bonding apparatus 30.

Figure 23B:
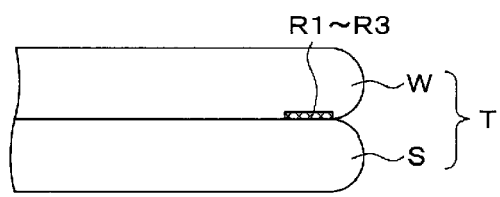

Thereafter, the processing target wafer W is transferred into the bonding apparatus 30 by the wafer transfer device 22. At this time, a front surface and a rear surface of the processing target wafer W are inverted by the wafer transfer device 22 or an inverting device (not shown). In the bonding apparatus 30, the processing target wafer W and the support wafer S are bonded as shown in FIG. 23B, so that a combined wafer T is formed.

Figure 23C:
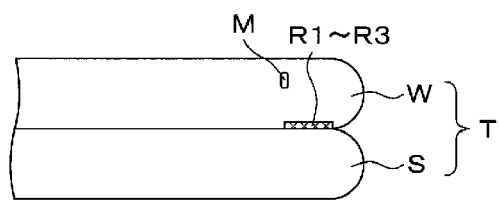

Subsequently, the combined wafer T is transferred into the modification layer forming apparatus 31 by the wafer transfer device 22. In the modification layer forming apparatus 31, a modification layer M is formed at a preset position within the processing target wafer W, as illustrated in FIG. 23C. That is, the modification layer M is formed to correspond to the modification grooves R1 and R2 and the modification surface R3.

Figure 23D:
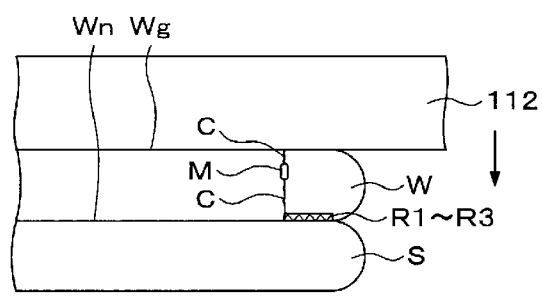
Figure 23E:
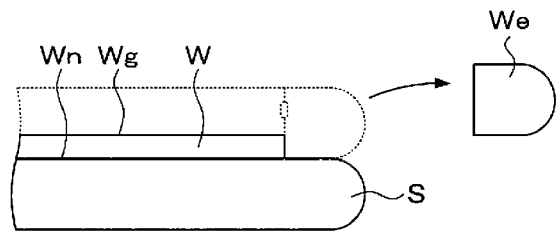

Then, the combined wafer T is transferred into the processing apparatus 32 by the wafer transfer device 22. In the processing apparatus 32, a processing surface Wg of the processing target wafer W is ground to a target thickness, as shown in FIG. 23D. If the grinding of the processing surface Wg progresses, the peripheral portion We of the processing target wafer W comes off and is removed, starting from the modification layer M and a crack C, as shown in FIG. 23E. At this time, since an interface (non-processing surface Wn) between the processing target wafer W and the support board S is roughened and has a reduced bonding force, the peripheral portion We can be removed appropriately.

Afterwards, the combined wafer T after being subjected to all the processings required is transferred into the cassette Ct on the cassette placing table 10 by the wafer transfer device 22. Then, the series of processes of the wafer processing in the substrate processing system 1 are completed.

Further, in the present exemplary embodiment, after either the modification grooves R1 and R2 or the modification surface R3 is formed at the processing target wafer W as shown in FIG. 23A, the processing target wafer W and the support wafer S are bonded as shown in FIG. 23B, and the modification layer M is then formed at the processing target wafer W as depicted in FIG. 23C. However, the order of these processings is not limited thereto. By way of example, the formation of either the modification grooves R1 and R2 or the modification surface R3, the formation of the modification layer M and the bonding of the wafers W and S may be performed in this sequence. Further, by way of example, the formation of the modification layer M, the formation of either the modification grooves R1 and R2 or the modification surface R3, and the bonding of the wafers W and S may be performed in this sequence. As another example, the formation of the modification layer M, the bonding of the wafers W and S, and the formation of either the modification grooves R1 and R2 or the modification surface R3 may be carried out in this sequence.

Furthermore, through the interface processing apparatus 300 and the modification layer forming apparatus 31 are separate in the present exemplary embodiment, they may be configured as one and the same apparatus. In such a case, the laser head 304 may be provided in the modification layer forming apparatus 31.

Alternatively, prior to the laser processing in the interface processing apparatus 300, a protective film may be formed on the non-processing surface Wn. In such a case, a coating apparatus (not shown) configured to form the protective film and a cleaning apparatus (not shown) configured to clean the protective film may be provided in the processing station 3 of the substrate processing system 1. The coating apparatus forms the protective film by coating a protective material on the entire non-processing surface Wn by, for example, spin coating. Further, the cleaning apparatus cleans and removes the protective film by supplying a cleaning liquid onto the entire non-processing surface Wn by, for example, spin cleaning.

First, in the substrate processing system 1, the protective film is formed on the entire non-processing surface Wn in the coating apparatus. Then, in the interface processing apparatus 300, the non-processing surface Wn at the peripheral portion We is modified, as shown in FIG. 23A. At this time, since the protective film is formed at a central portion We of the processing target wafer W, a damage on devices can be suppressed even if a particle is generated because of the laser light. Then, if the protective film of the non-processing surface Wn is removed in the cleaning apparatus, the processing target wafer W and the support wafer S can be bonded, as illustrated in FIG. 23B.

Figure 24:
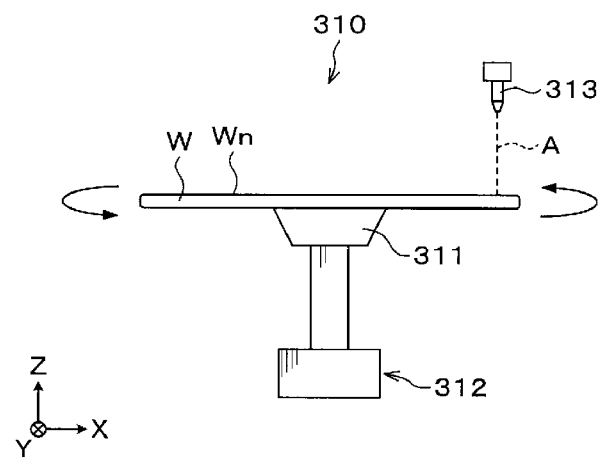
FIG. 24 is a side view illustrating a schematic configuration of an interface processing apparatus.

A second method of reducing the bonding force is, for example, to form a releasing film at a portion of the non-processing surface Wn of the processing target wafer W corresponding to the peripheral portion We to be removed by coating a releasing agent thereon. To elaborate, an interface processing apparatus 310 shown in FIG. 24, for example, is used. This interface processing apparatus 310 is provided at a proper position within, for example, the processing station 3 of the substrate processing system 1.

The interface processing apparatus 310 is equipped with a chuck 311 configured to hold the processing target wafer W with the non-processing surface Wn thereof facing upwards. The chuck 311 is configured to be rotated around a vertical axis by a rotating mechanism 312.

A nozzle 313 configured to coat a releasing agent A on the non-processing surface Wn at the peripheral portion We of the processing target wafer W is disposed above the chuck 311. The nozzle 313 communicates with a releasing agent source (not shown) configured to store and supply the releasing agent A. Further, the nozzle 313 may be configured to be movable in the X-axis direction, the Y-axis direction and the Z-axis direction by a moving mechanism (not shown). Any of various kinds of materials capable of reducing the bonding force at the interface between the processing target wafer W and the support wafer S may be used as the releasing agent A.

A wafer processing method performed by using the substrate processing system 1 equipped with the above-described interface processing apparatus 310 is the same as the wafer processing method described in FIG. 23A to FIG. 23E except that the laser processing of the interface processing apparatus 300 is replaced by the releasing agent coating processing of the interface processing apparatus 310. In the interface processing apparatus 310, the releasing film is formed on the non-processing surface Wn of the peripheral portion We by coating the releasing agent A on the corresponding non-processing surface Wn from the nozzle 313 while rotating the chuck 311. Since the bonding force between the processing target wafer W and the support wafer S is reduced at the peripheral portion We due to the releasing film, the peripheral portion We can be appropriately removed in FIG. 23E.

Further, if a rotation speed of the chuck 311 in the interface processing apparatus 310 is high, the coated releasing agent A is scattered to the outside of the processing target wafer W due to a centrifugal force. Meanwhile, if the rotation speed of the chuck 311 is at a medium level, there is a concern that the releasing agent A may reach the processing surface Wg of the processing target wafer W. Thus, a rinse liquid for the releasing agent A may be supplied from this processing surface Wg side. Further, if the rotation speed of the chuck 311 is low, the releasing agent A may be suctioned and drained from the outside of the processing target wafer W.

A third method of reducing the bonding force is, for example, to thinly etch a portion of the non-processing surface Wn of the processing target wafer W corresponding to the peripheral portion We to be removed by using a chemical liquid or the like. By way of example, for a TEOS film, the etching may be performed by using hydrofluoric acid. An interface processing apparatus configured to perform this etching is not particularly limited, and any of various commonly known etching apparatuses may be utilized.

In the present exemplary embodiment, an etching processing upon the peripheral portion We is performed instead of the laser processing of the interface processing apparatus 300 shown in FIG. 23A. The etched peripheral portion We is removed to form a step with respect to the central portion Wc, or the etched peripheral portion We is roughened. Accordingly, when the processing target wafer W and the support wafer S are bonded by the bonding apparatus 30 as illustrated in FIG. 23B, the processing target wafer W and the support wafer S are not bonded at the peripheral portion We. Therefore, the peripheral portion We can be appropriately removed in FIG. 23E.

If the bonding apparatus 30 is a bonding apparatus using plasma as stated above, for example, a fourth method of reducing the bonding force is to irradiate the plasma to a portion of the non-processing surface Wn of the processing target wafer W corresponding to the peripheral portion We to be removed when the bonding is performed in the bonding apparatus 30. As stated above, in the bonding apparatus 30, oxygen ions or nitrogen ions in the plasma are irradiated to the non-processing surface Wn, and the non-processing surface Wn is plasma-processed and activated. Thus, in this bonding apparatus 30, a shield plate may be provided above the non-processing surface Wn lest the oxygen ions or the nitrogen ions should be irradiated to the non-processing surface Wn at the peripheral portion We.

In such a case, in the bonding apparatus 30, though the non-processing surface Wn at the central portion We of the processing target wafer W is activated by the oxygen ions or the nitrogen ions, the non-processing surface Wn at the peripheral portion We is not activated. Accordingly, when the processing target wafer W and the support wafer S are bonded by the bonding apparatus 30 as shown in FIG. 23B, the processing target wafer W and the support wafer S are not bonded at the peripheral portion We. Therefore, the peripheral portion We can be appropriately removed in FIG. 23E.

Further, in the above-described exemplary embodiments, the bonding force is reduced by performing the above-descried four processings on the non-processing surface Wn of the processing target wafer W before being bonded. However, the same processings may be performed on the bonding surface Sj of the support wafer S.

In the above-described exemplary embodiment, as a way to remove the peripheral portion We efficiently, the bonding force at the portion of the interface between the processing target wafer W and the support wafer S corresponding to the peripheral portion We to be removed is reduced after the processing target wafer W and the support wafer S are bonded in the bonding apparatus 30. That is, by reducing the bonding force, the peripheral portion We can be removed efficiently. As a specific example method of reducing the bonding force, the following method may be used.

Figure 25:
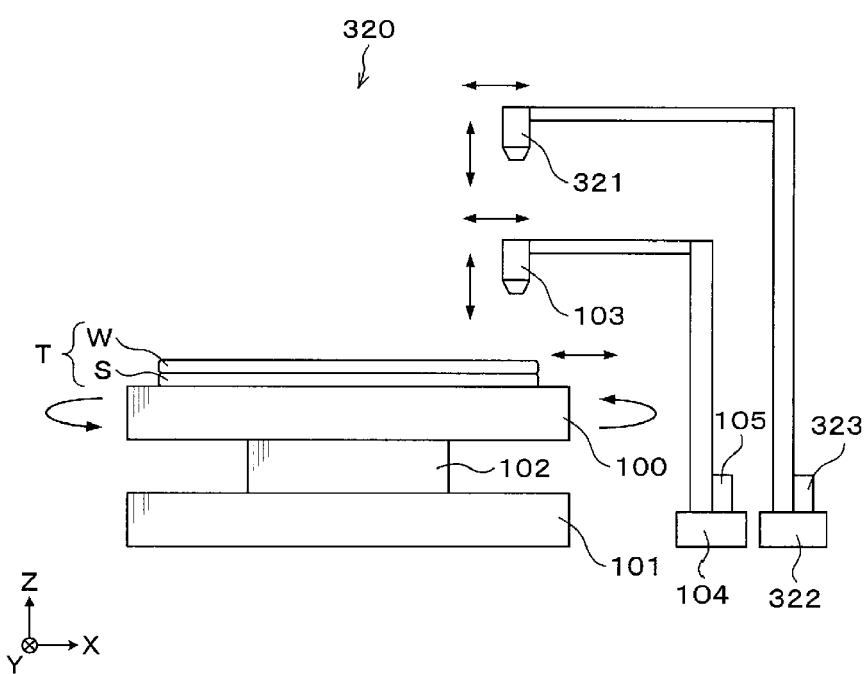
FIG. 25 is a side view illustrating a schematic configuration of a processing apparatus.

By way of example, by allowing laser light to penetrate the processing target wafer W to reach the non-processing surface Wn, ablation is induced at each interface. By way of example, a processing apparatus 320 shown in FIG. 25 is used. The processing apparatus 320 is provided in, for example, the processing station 3 of the substrate processing system 1 instead of the modification layer forming apparatus 31.

The processing apparatus 320 includes a laser head 321, a moving mechanism 322 and an elevating mechanism 323 in addition to the components of the modification layer forming apparatus 31. The laser head 321 is configured to irradiate laser light to the non-processing surface Wn to modify it. The laser head 321 concentrates and irradiates the laser light having a wavelength featuring transmissivity for the processing target wafer W to a preset position within the processing target wafer W as laser light in a high-frequency pulse shape emitted from a laser light oscillator (not shown). Accordingly, a portion within the processing target wafer W to which the laser light is concentrated is modified. The moving mechanism 322 is configured to move the laser head 321 in the X-axis direction and the Y-axis direction. The moving mechanism 322 is implemented by a general precise XY-stage. Further, the elevating mechanism 323 is configured to move the laser head 321 in the Z-axis direction. The processing apparatus 320 having the above-described configuration combines a function of a modification layer forming apparatus and a function of an interface processing apparatus.

In the processing apparatus 320, when the interface between the processing target wafer W and the support wafer S is processed, the inside of the processing target wafer W is modified or the inside of the device layer D is modified. That is, the interface of the present exemplary embodiment includes the inside of the processing target wafer W and the inside of the device layer D.

Figure 26:
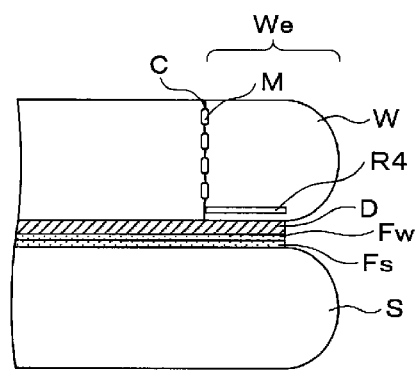
FIG. 26 is a longitudinal cross sectional view illustrating a state in which a modification surface is formed within a processing target wafer according to another exemplary embodiment.
Figure 27:
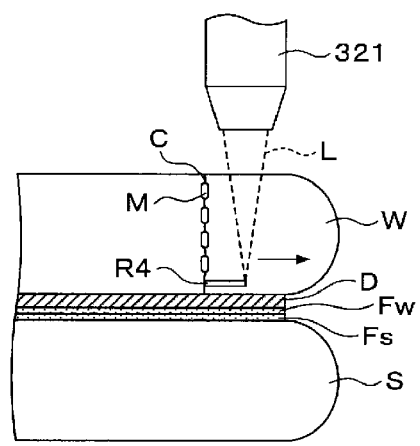
FIG. 27 is a longitudinal cross sectional view illustrating how to form the modification surface shown in FIG. 26.

When modifying the inside of the processing target wafer W as shown in FIG. 26, a modification surface R4 is formed in the vicinity of the non-processing surface Wn at the peripheral portion We (an outside of a modification layer M). As a processing method therefor, laser light L is irradiated toward the inside of the processing target wafer W from the laser head 321, as illustrated in FIG. 27. The laser light L is concentrated after penetrating the inside of the processing target wafer W, and a portion where the laser light L is concentrated is modified. Then, while rotating the chuck 100 with the rotating mechanism 102 and moving the laser head 321 outwards in a diametrical direction with the moving mechanism 322, the laser light L is irradiated to the inside of the processing target wafer W from the laser head 321. As a result, the modification surface R4 is formed. Further, in forming the modification surface R4, the chuck 100 may be moved in the diametrical direction by the moving mechanism 101, or both the laser head 321 and the chuck 100 may be moved.

Moreover, when the modification surface R4 is formed within the processing target wafer W as stated above, a part of the processing target wafer W remains on the support wafer S after the peripheral portion We is removed. Thus, after the peripheral portion We is removed, this remaining part of the processing target wafer W may be removed by being etched.

Figure 28:
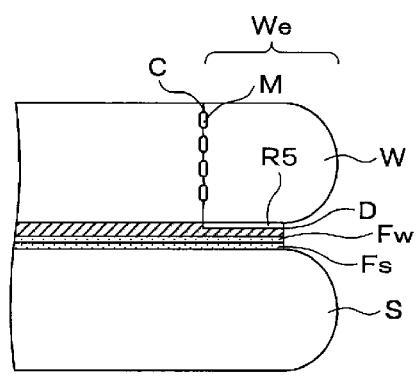
FIG. 28 is a longitudinal cross sectional view illustrating a state in which a modification surface is formed in a device layer of a processing target wafer according to still another exemplary embodiment.

When modifying the inside of the device layer D as shown in FIG. 28, a modification surface R5 is formed within the device layer D at the peripheral portion We (an outside of a modification layer M). As a processing method therefor, three methods as depicted in FIG. 29A to FIG. 29C may be used, for example.

Figure 29A:
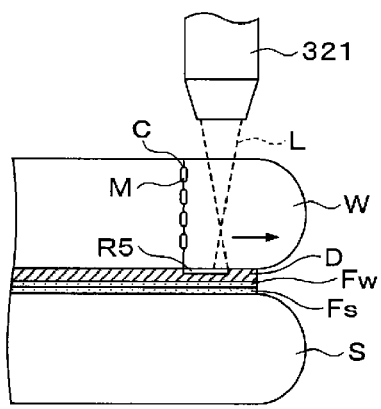
FIG. 29A to FIG. 29C are longitudinal cross sectional views illustrating how to form the modification surface shown in FIG. 28.

A first processing method is to set a condensing point of the laser light L from the laser head 321 to be located above the device layer D within the processing target wafer W, as illustrated in FIG. 29A. In this case, energy of the laser light L is set to be small to the extent that the processing target wafer W is not modified even if the laser light L is concentrated. Accordingly, though the laser light L is once concentrated within the processing target wafer W, the defocused and spread laser light L penetrates the processing target wafer W and is irradiated to the device layer D. The laser light L is absorbed into the device layer D, causing ablation of the device layer D. Then, while rotating the chuck 100 by the rotating mechanism 102 and moving the laser head 321 outwards in the diametrical direction by the moving mechanism 322, the laser light L is irradiated from the laser head 321. As a result, the modification surface R5 is formed in the device layer D. Further, in forming the modification surface R5, the chuck 100 may be moved in the diametrical direction by the moving mechanism 101, or both the laser head 321 and the chuck 100 may be moved.

Figure 29B:
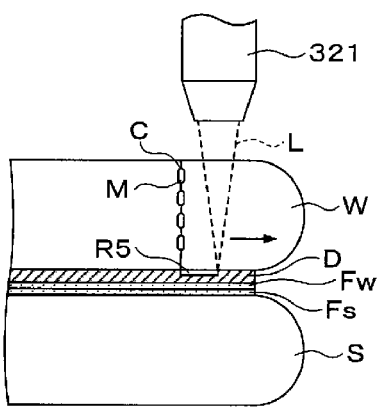

A second processing method is to set the condensing point of the laser light L from the laser head 321 to be located within the device layer D, as illustrated in FIG. 29B. In this case, the laser light L penetrates the processing target wafer W and is irradiated to the device layer D, causing ablation of the device layer D. Then, while rotating the chuck 100 by the rotating mechanism 102 and moving the laser head 321 outwards in the diametrical direction by the moving mechanism 322, the laser light L is irradiated from the laser head 321. As a result, the modification surface R5 is formed in the device layer D. Further, in forming the modification surface R5, the chuck 100 may be moved in the diametrical direction by the moving mechanism 101, or both the laser head 321 and the chuck 100 may be moved.

Figure 29C:
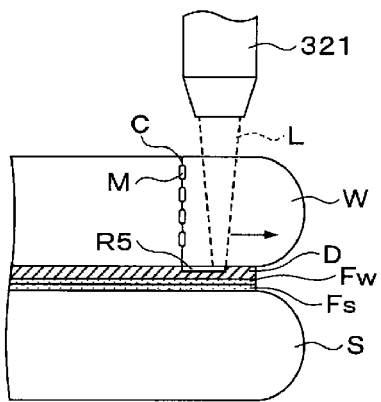

A third processing method is to set the condensing point of the laser light L from the laser head 321 to be located under the device layer D, as illustrated in FIG. 29C. In this case, the laser light L penetrates the processing target wafer W and is irradiated to the device layer D, causing ablation of the device layer D. Further, since the laser light L is absorbed into the device layer D, it is not concentrated under the device layer D. Then, while rotating the chuck 100 by the rotating mechanism 102 and moving the laser head 321 outwards in the diametrical direction by the moving mechanism 322, the laser light L is irradiated from the laser head 321. As a result, the modification surface R5 is formed in the device layer D. Further, in forming the modification surface R5, the chuck 100 may be moved in the diametrical direction by the moving mechanism 101, or both the laser head 321 and the chuck 100 may be moved.

Further, in case of forming the modification surface R5 in the device layer D, the ablation of the device layer D at the peripheral portion We may affect the device layer D at the central portion Wc inside. Thus, it is desirable to form the modification surface R5 after forming the modification layer M4 in the device layer D, as shown in FIG. 14D. In such a case, the modification layer M4 serves to block the influence of the ablation, so that the central portion Wc can be securely suppressed from being affected by the ablation.

Now, a wafer processing performed by using the substrate processing system 1 equipped with the above-described processing apparatus 320 will be explained. In the present exemplary embodiment, detailed description on the same processings as those described in the first exemplary embodiment will be omitted.

Figure 30A:
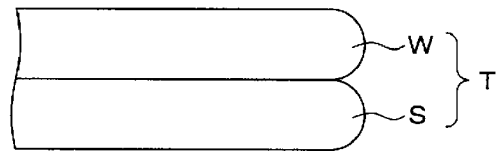
FIG. 30A to FIG. 30E are explanatory diagrams illustrating a state of a processing target wafer in major processes of a wafer processing according to yet another exemplary embodiment.

First, a processing target wafer W is taken out of the cassette Cw by the wafer transfer device 22, and transferred into the bonding apparatus 30. Subsequently, a support wafer S is taken out of the cassette Cs by the wafer transfer device 22, and transferred into the bonding apparatus 30. In the bonding apparatus 30, the processing target wafer W and the support wafer S are bonded as shown in FIG. 30A, so that a combined wafer T is formed.

Subsequently, the combined wafer T is transferred into the processing apparatus 320 by the wafer transfer device 22. In the processing apparatus 320, the laser head 103 is moved to above the peripheral portion We. Then, while rotating the chuck 100, laser light is irradiated to the inside of the processing target wafer W from the laser head 103, so that a modification layer M is formed at a preset position within the processing target wafer W, as illustrated in FIG. 30B.

Thereafter, in the processing apparatus 320, the laser head 103 is retreated, and the laser head 321 is moved to above the peripheral portion We. Then, while rotating the chuck 100 and moving the laser head 321 outwards in the diametrical direction, laser light is irradiated from the laser head 321. As a result, a modification surface R4 is formed within the processing target wafer W or a modification surface R5 is formed in a device layer D, as illustrated in FIG. 30C.

Figure 30B:
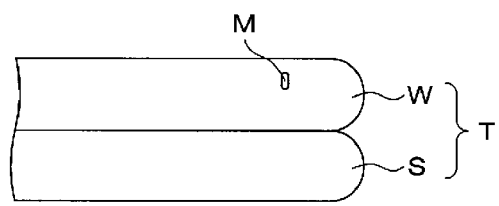
Figure 30C:
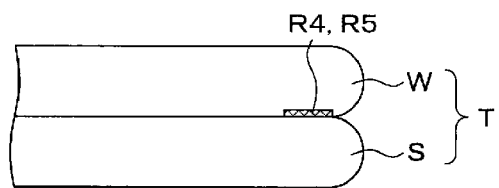

Further, the order of the formation of the modification layer M shown in FIG. 30B and the formation of the modification surface R4 or R5 shown in FIG. 30C may be reversed.

Figure 30D:
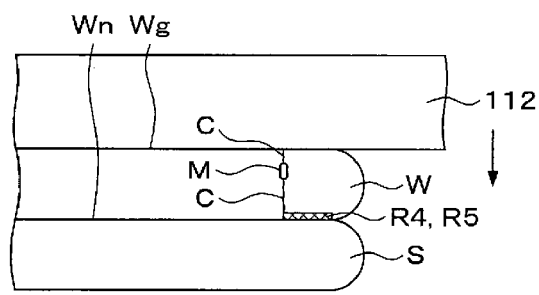
Figure 30E:
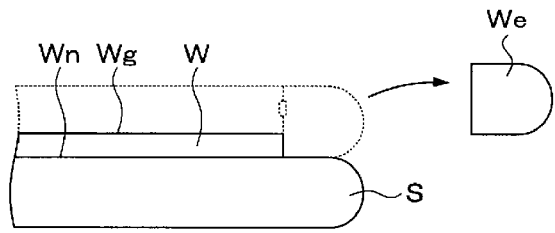

Subsequently, the combined wafer T is transferred into the processing apparatus 32 by the wafer transfer device 22. In the processing apparatus 32, a processing surface Wg of the processing target wafer W is ground to a target thickness, as illustrated in FIG. 30D. If the grinding of the processing surface Wg progresses, a peripheral portion We of the processing target wafer W comes off and is removed starting from the modification layer M and a crack C, as illustrated in FIG. 30E. At this time, since the modification surface R4 or R5 is formed at an interface between the processing target wafer W and the support wafer S and a bonding force thereat is reduced, the peripheral portion We can be appropriately removed.

Then, the combined wafer T after being subjected to all the processings required is transferred into the cassette Ct on the cassette placing table 10 by the wafer transfer device 22. Then, the series of processes of the wafer processing in the substrate processing system 1 are completed.

In the present exemplary embodiment, the same effects as obtained in the first and second exemplary embodiments can be achieved. Further, in the processing apparatus 320, since the formation of the modification layer M and the formation of the modification surface R4 or F5 are performed by using the same chuck 100, the processing target wafer W is not eccentric in the processing by the laser head 103 and the processing by the laser head 321. As a consequence, a position of the modification layer M and an inner periphery position of the modification surface R4 or R5 can be made coincident, so that the peripheral portion We can be removed more appropriately.

Moreover, in the processing apparatus 320, the laser head 103 and the laser head 321 may not be provided separately, and a common head may be shared. Further, the laser head 103 and the laser head 321 of the processing apparatus 320 may be provided in other apparatuses. By way of example, the laser head 103 and the laser head 321 may be provided in the modification layer forming apparatus 31 and the interface processing apparatus, respectively.

Further, the present exemplary embodiment is also applicable to the case where the second processing target wafer W2 is further stacked on the combined wafer T, as illustrated in FIG. 12A to FIG. 12D. At this time, if a position of the peripheral portion We of the second processing target wafer W2 to be removed coincides with a position of the combined wafer T, the formation of the modification surface R4 or R5 may be omitted.

In addition, as illustrated in FIG. 13A to FIG. 13B, the present exemplary embodiment is also applicable to the case where the peripheral portion We to be removed from the second processing target wafer W2 at the upper side is set to be located at the inner side than the peripheral portion We to be removed from the first processing target wafer W at the lower side. In this case, however, in the second processing target wafer W2, it is desirable that the modification surface R4 or R5 is formed at a portion corresponding to the peripheral portion We to be removed from the first processing target wafer W1.

In the above-described exemplary embodiments, it is desirable that a position of the modification groove R1 and a position of an inner periphery of the modification surface R3 which are formed at the processing target wafer W before being bonded and the inner periphery position of the modification surface R4 or R5 formed at the processing target wafer W after being bonded all coincide with the position of the modification layer M.

Figure 31:
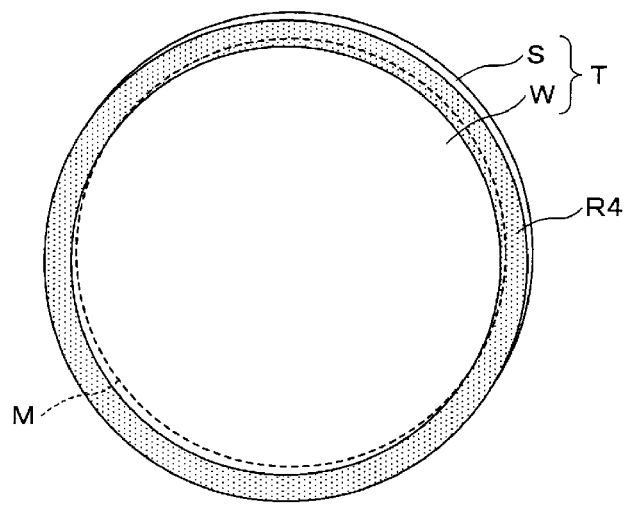
FIG. 31 is a plan view illustrating a state in which a processing target wafer is eccentric in a combined wafer.

To explain the reason for this, as illustrated in FIG. 31, assume a case where the processing target wafer W is eccentrically bonded with respect to the combined wafer T and the position of the modification layer M and the inner periphery position of the modification surface R4 are deviated from each other. In this case, there exists a point where the modification layer M is located at an inner side than the inner periphery of the modification surface R4 in the diametrical direction and a point where the modification layer M is located at an outer side than the inner periphery of the modification surface R4 in the diametrical direction, as depicted in FIG. 31.

Figure 32A:
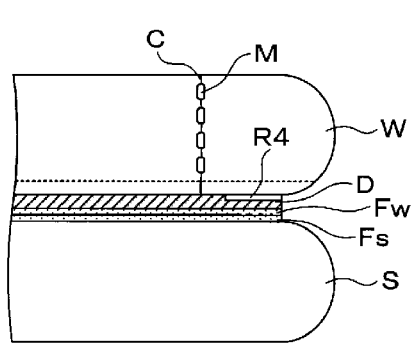
FIG. 32A and FIG. 32B are explanatory diagrams illustrating a case where a modification layer is located at an inner side than an inner periphery of a modification surface in a diametrical direction.
Figure 32B:
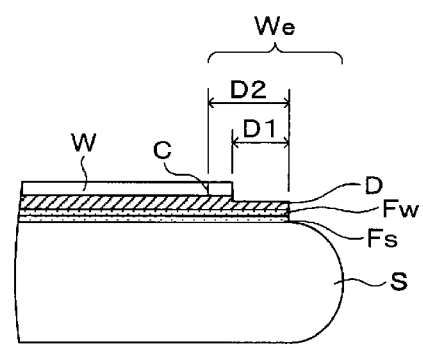

If the modification layer M is located at the inner side than the inner periphery of the modification surface R4 in the diametrical direction as illustrated in FIG. 32A, when the peripheral portion We is removed by grinding the processing surface Wg of the processing target wafer W, a width D1 of an actually removed peripheral portion may be smaller than a target width D2 of the peripheral portion We supposed to be removed, as shown in FIG. 32B. Further, since the removed peripheral portion comes off without being guided by the modification layer M and the crack C, an outer side surface of the processing target wafer W may become rough after the corresponding peripheral portion is removed.

Furthermore, if a distance between the modification layer M and the inner periphery of the modification surface R4 is sufficiently small even in case that the modification layer M is located at the inner side than the inner periphery of the modification surface R4 in the diametrical direction, a bonding force between the processing target wafer W and the support wafer S is reduced sufficiently, so that the peripheral portion We can be removed appropriately.

If the modification layer M is located at the outer side than the inner periphery of the modification surface R4 in the diametrical direction as illustrated in FIG. 33A, the modification surface R4 is left between the processing target wafer W and the device layer D as illustrated in FIG. 33B when the peripheral portion We is removed by grinding the processing surface Wg of the processing target wafer W. At a portion where this modification surface R4 remains, the processing target wafer W and the device layer D may be detached, raising a likelihood of chipping.

As a way to resolve the problem of the deviation between the position of the modification layer M and the inner periphery position of the modification surface R4, the following two methods may be utilized. A first deviation elimination method is to detect eccentricity of the processing target wafer W in the combined wafer T and adjust the position of the modification layer M or the inner periphery position of the modification surface R4 based on the detection result. A second deviation elimination method is to detect the position of the modification layer M or the inner periphery position of the modification surface R4 and adjust a position of a modification surface R4 or a modification layer M formed in a following processing based on the detection result.

In performing the above-stated two deviation elimination methods, a processing apparatus 330 shown in FIG. 34, for example, is used. The processing apparatus 330 is provided in, for example, the processing station 3 of the substrate processing system 1 instead of the processing apparatus 320. The processing apparatus 330 further includes an eccentricity detector 331 for carrying out the first deviation elimination method and a position detector 332 for carrying out the second deviation elimination method in addition to the components of the processing apparatus 320.

The first deviation elimination method will be elaborated. The eccentricity detector 331 is disposed above a central portion of the chuck 100. Further, the eccentricity detector 331 is configured to be movable in the X-axis direction, the Y-axis direction and the Z-axis direction by a moving mechanism (not shown). The eccentricity detector 331 is equipped with, by way of non-limiting example, a CCD camera. The eccentricity detector 331 images the combined wafer T held by the chuck 100, specifically, at least three points of a peripheral portion thereof, for example. Then, a deviation of a center of the processing target wafer W from a rotation center of the chuck 100, that is, eccentricity of the processing target wafer W in the combined wafer T is detected. Further, the configuration of the eccentricity detector 331 is not limited to the present exemplary embodiment, and the eccentricity detector 331 may have, by way of non-limiting example, an IR camera. In such a case, the eccentricity detector 331 detects the eccentricity of the processing target wafer W in the combined wafer T by imaging, for example, an alignment mark formed at the processing target wafer W.

The first deviation elimination method is carried out by using a detection result in this eccentricity detector 331. Here, the description will be provided for a case where a wafer processing shown in FIG. 30A to FIG. 30E is performed in the substrate processing system 1.

First, in the bonding apparatus 30, a processing target wafer W and a support wafer S are bonded as shown in FIG. 30A, so that a combined wafer T is obtained. Then, the combined wafer T is transferred into the processing apparatus 330. In the processing apparatus 330, the combined wafer T is held by the chuck 100, and then imaged by the eccentricity detector 331 to detect eccentricity of the processing target wafer W in the combined wafer T. A detection result of the eccentricity detector 331 is outputted to the controller 40.

In the controller 40, a central axis of the chuck 100, an irradiation axis of laser light irradiated from the laser head 103 or an irradiation axis of laser light irradiated from the laser head 321 are adjusted based on the detection result of the eccentricity detector 331, that is, the eccentricity of the processing target wafer W. By adjusting the central axis of the chuck 100 or the irradiation axis of the laser head 103, a modification layer M can be appropriately formed in the processing target wafer W, as depicted in FIG. 30B. Further, by adjusting the central axis of the chuck 100 or the irradiation axis of the laser head 321, a modification surface R4 can be appropriately formed in the processing target wafer W, as depicted in FIG. 30C.

As stated above, by adjusting the central axis of the chuck 100, the irradiation axis of the laser head 103 or the irradiation axis of the laser head 321 based on the detection result upon the eccentricity of the processing target wafer W obtained by the eccentricity detector 331, a position of the modification layer M and an inner periphery position of the modification surface R4 can be made coincident.

Further, the eccentricity detector 331 may be provided in an eccentricity detecting device (not shown) which is provided at an outside of the processing apparatus 320. In this configuration, when the combined wafer T is transferred into the processing apparatus 320 from the eccentricity detecting device by the wafer transfer device 22, the combined wafer T is transferred such that the center of the processing target wafer W coincides with the center of the chuck 100 based on a detection result upon the eccentricity of the processing target wafer W obtained by the eccentricity detector 331. Accordingly, the modification layer M can be appropriately formed in the processing target wafer W, as shown in FIG. 30B, and, also, the modification surface R4 can be appropriately formed within the processing target wafer W or in a device layer, as shown in FIG. 30C. Thus, the position of the modification layer M and the inner periphery position of the modification surface R4 can be made coincident.

Furthermore, the eccentricity detector 331 may detect eccentricity of a second processing target wafer W2 further stacked on and bonded to the combined wafer T. In this case as well, a position of a modification layer M and an inner periphery position of a modification surface R4 formed in the second processing target wafer W2 can be made coincident based on a detection result upon the eccentricity of the second processing target wafer W2 with respect to the combined wafer T.

Now, the second deviation elimination method will be discussed. The position detector 332 is disposed above a peripheral portion of the chuck 100. Further, the position detector 332 is configured to be movable in the X-axis direction, the Y-axis direction and the Z-axis direction by a moving mechanism (not shown). By way of non-limiting example, an IR camera using infrared rays may be used as the position detector 332. This position detector 332 detects a position of a modification layer M or an inner periphery position of a modification surface R4 formed in a processing target wafer W in a combined wafer T held by the chuck 100.

The second deviation elimination method is carried out by using a detection result in the position detector 332. Here, the description will be provided for a case where the wafer processing shown in FIG. 30A to FIG. 30E is performed in the substrate processing system 1.

First, in the bonding apparatus 30, the processing target wafer W and a support wafer S are bonded as shown in FIG. 30A, so that the combined wafer T is obtained. Then, the combined wafer T is transferred into the processing apparatus 330. In the processing apparatus 330, the modification layer M is formed in the processing target wafer W, as shown in FIG. 30B, by using the laser head 103.

If the modification layer M is formed in the processing target wafer W, this modification layer M within the processing target wafer W is imaged by using the infrared rays of the position detector 332, so that a position of the modification layer M is detected. This detection result of the position detector 332 is outputted to the controller 40.

In the controller 40, the central axis of the chuck 100 or the irradiation axis of the laser head 321 is adjusted based on the detection result of the position detector 332, that is, the position of the modification layer M. Accordingly, the modification surface R4 can be appropriately formed in the processing target wafer W, as depicted in FIG. 30C. As a result, the position of the modification layer M and an inner periphery position of the modification surface R4 can be made coincident.

Further, the order of the formation of the modification layer M shown in FIG. 30B and the formation of the modification surface R4 shown in FIG. 30C may be reversed. In such a case, the modification surface R4 is imaged by using the infrared rays of the position detector 332 after the modification surface R4 is formed in the processing target wafer W, so the inner periphery position of the modification surface R4 is detected. This detection result of the position detector 332 is outputted to the controller 40.

In the controller 40, the central axis of the chuck 100 or the irradiation axis of the laser head 103 is adjusted based on the detection result of the position detector 332, that is, the inner periphery position of the modification surface R4. Accordingly, the modification layer M can be appropriately formed in the processing target wafer W. As a result, the position of the modification layer M and the inner periphery position of the modification surface R4 can be made coincident.

Moreover, in the above-described exemplary embodiments, the position detector 332 detects the position of the modification layer M or the inner periphery position of the modification surface R4 formed in the processing target wafer W after being bonded. However, the position detector 332 may detect the position of the modification layer M or the inner periphery position of the modification surface R4 formed in the processing target wafer W before being bonded. In such a case as well, the modification surface R4 or the modification layer M can be appropriately formed after the detection by the position detector 332 so that the position of the modification layer M and the inner periphery position of the modification surface R4 can be made coincident.

That is to say, regardless of which one of the formation of the modification layer M and the formation of the modification surface R4 is first performed, the modification surface R4 or the modification layer M can be appropriately formed afterwards by detecting the position of the modification layer M or the inner periphery position of the modification surface R4 in the position detector 332, so that the position of the modification layer M and the inner periphery position of the modification surface R4 can be made coincident.

Figure 35:
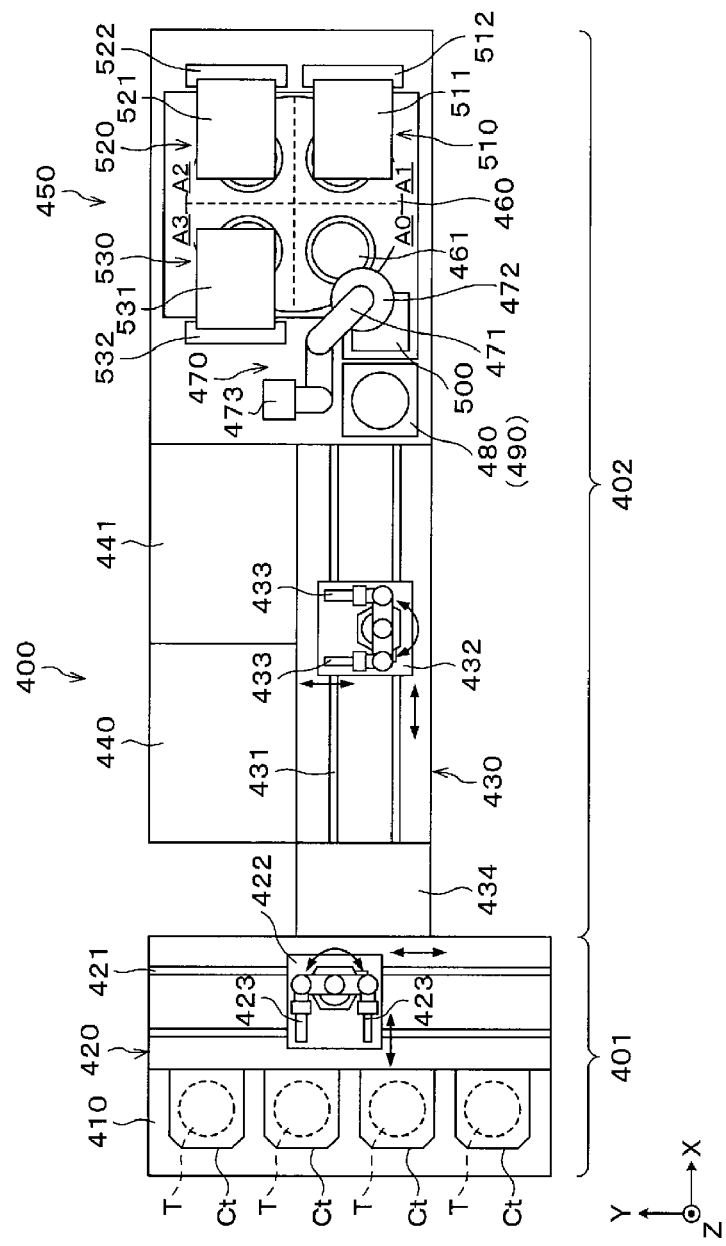
FIG. 35 is a plan view schematically illustrating a configuration of a substrate processing system according to a third exemplary embodiment.

Now, a substrate processing system according to a third exemplary embodiment of the present disclosure will be described. FIG. 35 is a plan view schematically illustrating a configuration of a substrate processing system 400 according to the third exemplary embodiment.

The substrate processing system 400 is equipped with a carry-in/out station 401 in which cassettes Ct capable of accommodating a multiple number of combined wafers T are carried to/from the outside; and a processing station 402 equipped with various kinds of processing apparatuses configured to perform preset processings on the combined wafer T. The carry-in/out station 401 and the processing station 402 are connected as one body.

The carry-in/out station 401 is equipped with a cassette placing table 410. In the shown example, a plurality of, for example, four cassettes Ct can be arranged in a row in the Y-axis direction on the cassette placing table 410. The number of the cassettes Ct placed on the cassette placing table 410 is not limited to the present exemplary embodiment and may be set as required.

In the carry-in/out station 401, a wafer transfer section 420 is provided adjacent to the cassette placing table 410. Provided in the wafer transfer section 420 is a wafer transfer device 422 configured to be movable on a transfer path 421 elongated in the Y-axis direction. The wafer transfer device 422 is equipped with, for example, two transfer arms 423 configured to hold and transfer the combined wafer T. Each transfer arm 423 is configured to be movable in a horizontal direction and a vertical direction and pivotable around a horizontal axis and a vertical axis. Further, the configuration of the transfer arm 423 is not limited to the exemplary embodiment, and various other configurations may be adopted.

A wafer transfer section 430 is provided in the processing station 402. Provided in the wafer transfer section 430 is a wafer transfer device 432 configured to be movable on a transfer path 431 elongated in the X-axis direction. The wafer transfer device 432 is configured to transfer the combined wafer T to a transition device 434, wet etching apparatuses 440 and 441, and a processing apparatus 450 to be described later. Further, the wafer transfer device 432 is equipped with, for example, two transfer arms 433 configured to hold and transfer the combined wafer T. Each transfer arm 433 is configured to be movable in a horizontal direction, a vertical direction and pivotable around a horizontal axis and a vertical axis. Further, the configuration of the transfer arm 433 is not limited to the exemplary embodiment, and various other configurations may be adopted.

The transition device 434 configured to deliver the combined wafer T is provided between the wafer transfer section 420 and the wafer transfer section 430.

The wet etching apparatuses 440 and 441 are arranged at a positive Y-axis side of the wafer transfer section 430 in this sequence in the X-axis direction from the carry-in/out station 401. In each of the wet etching apparatuses 440 and 441, wet etching is performed on a processing surface Wg of a processing target wafer W by using a chemical liquid such as, but not limited to, hydrofluoric acid.

The processing apparatus 450 is disposed at a positive X-axis side of the wafer transfer section 430. In the processing apparatus 450, processings such as grinding and cleaning are performed on the processing target wafer W. The processing apparatus 450 is equipped with a rotary table 460, a transfer unit 470, a processing unit 480, a first cleaning unit 490, a second cleaning unit 500, a rough grinding unit 510, an intermediate grinding unit 520, and a finishing grinding unit 530.

The rotary table 460 is configured to be rotated by a rotating mechanism (not shown). Four chucks 461 configured to attract and hold the combined wafer T are provided on the rotary table 460. The chucks 461 are arranged on a circle concentric with the rotary table 460 at a regular distance therebetween, that is, an angular distance of 90 degrees therebetween. The four chucks 461 are configured to be moved to a delivery position A0 and processing positions A1 to A3 as the rotary table 460 is rotated. Further, each of the chucks 461 is configured to be rotatable around a vertical axis by a rotating mechanism (not shown).

In the present exemplary embodiment, the delivery position A0 is a position at a negative X-axis and negative Y-axis side of the rotary table 460. The second cleaning unit 500, the processing unit 480 and the first cleaning unit 490 are arranged at a negative X-axis side of the delivery position A0. The processing unit 480 and the first cleaning unit 490 are stacked in this sequence from the top. The first processing position A1 is a position at a positive X-axis and negative Y-axis side of the rotary table 460, and the rough grinding unit 510 is disposed thereat. The second processing position A2 is a position at a positive X-axis and positive Y-axis side of the rotary table 460, and the intermediate grinding unit 520 is disposed thereat. The third processing position A3 is a position at a negative X-axis and positive Y-axis side of the rotary table 460, and the finishing grinding unit 530 is disposed thereat.

The transfer unit 470 is a multi-joint robot equipped with a plurality of, for example, there arms 471. Each of the three arms 471 is configured to be rotatable. The arm 471 at a leading end is provided with a transfer pad 472 configured to attract and hold the combined wafer T. Further, the arm 471 at a base end is mounted to a moving mechanism 473 configured to move the arm 471 in a vertical direction. The transfer unit 470 having this configuration is capable of transferring the combined wafer T to/from the delivery position A0, the processing unit 480, the first cleaning unit 490 and the second cleaning unit 500.

In the processing unit 480, a direction of the combined wafer T before being subjected to a grinding processing in the horizontal direction is adjusted. By way of example, while rotating the combined wafer T held by the chuck 100, a position of a notch of the processing target wafer W is detected by a detector (not shown), and by adjusting the position of the notch, the direction of the combined wafer T in the horizontal direction is adjusted.

Further, the processing unit 480 includes the components of the processing apparatus 320, that is, the chuck 100, the moving mechanism 101, the rotating mechanism 102, the laser head 103, the moving mechanism 104, the elevating mechanism 105, the laser head 321, the moving mechanism 322, and the elevating mechanism 323. In the processing unit 480, a modification layer M is formed in the processing target wafer W by the laser head 103, and a modification surface R4 or R5 is formed in the processing target wafer W by the laser head 321. Further, in case that the modification layer M is previously formed in the processing target wafer W, only the modification surface R4 or R5 is formed in the processing unit 480. On the contrary, in case that the modification surface R4 or R5 is previously formed in the processing target wafer W, only the modification layer M is formed in the processing unit 480.

In the first cleaning unit 490, the processing surface Wg of the processing target wafer W after being subjected to the grinding processing is cleaned, more specifically, cleaned by spinning. While rotating the combined wafer T held by, for example, a spin chuck (not shown), a cleaning liquid is supplied onto the processing surface Wg from a cleaning liquid nozzle (not shown). The supplied cleaning liquid is diffused on the processing surface Wg, so that the processing surface Wg is cleaned.

The second cleaning unit 500 cleans a non-bonding surface Sn of a support wafer S in the state that the processing target wafer W after being subjected to the grinding processing is held by the transfer pad 472, and also cleans the transfer pad 472.

In the rough grinding unit 510, the processing surface Wg of the processing target wafer W is roughly ground. The rough grinding unit 510 has a rough grinder 511. The rough grinder 511 includes the grinding whetstone 112, the spindle 113 and the driver 114 shown in FIG. 6. Further, the rough grinder 511 is configured to be moved in the vertical direction and the horizontal direction along a supporting column 512.

The intermediate grinding unit 520, the processing surface Wg of the processing target wafer W is ground to a medium level. The intermediate grinding unit 520 includes an intermediate grinder 521. The intermediate grinder 521 is equipped with the grinding whetstone 112, the spindle 113 and the driver 114 shown in FIG. 6. Further, the intermediate grinding unit 521 is configured to be moved in the vertical direction and the horizontal direction along a supporting column 522. Furthermore, a particle size of abrasive grains of the grinding whetstone 112 of the intermediate grinder 521 is smaller than a particle size of abrasive grains of the grinding whetstone 112 of the rough grinder 511.

In the finishing grinding unit 530, the processing surface Wg of the processing target wafer W is ground finely. The finishing grinding unit 530 includes a finishing grinder 531. The finishing grinder 531 is equipped with the grinding whetstone 112, the spindle 113 and the driver 114 shown in FIG. 6. Further, the finishing grinder 531 is configured to be moved in the vertical direction and the horizontal direction along a supporting column 532. In addition, a particle size of abrasive grains of the grinding whetstone 112 of the finishing grinder 531 is smaller than a particle size of abrasive grains of the grinding whetstone 112 of the intermediate grinder 521.

Now, a wafer processing performed by using the substrate processing system 400 having the above-described configuration will be described. In the present exemplary embodiment, the description will be provided for a case where a wafer processing shown in FIG. 30A to FIG. 30E is performed.

First, the cassette Ct accommodating therein the multiple number of combined wafers T is placed on the cassette placing table 410 of the carry-in/out station 401. In the present exemplary embodiment, a processing target wafer W and a support wafer S are bonded as shown in FIG. 30A in a bonding apparatus (not shown) provided at an outside of the substrate processing system 400.

Then, the combined wafer T is taken out of the cassette Ct by the wafer transfer device 422, and transferred into the transition device 434. Subsequently, the combined wafer T is taken out of the transition device 434 by the wafer transfer device 432, and transferred into the processing apparatus 450.

The combined wafer T transferred into the processing apparatus 450 is delivered into the processing unit 480. In the processing unit 480, the direction of the processing target wafer W in the horizontal direction is adjusted by the detector (not shown). Further, in the processing unit 480, a modification layer M is formed in the processing target wafer W as shown in FIG. 30B by using the laser head 103, and, then, a modification surface R4 or R5 is formed in the processing target wafer W as shown in FIG. 30C by using the laser head 321.

Thereafter, the combined wafer T is transferred to the delivery position A0 from the processing unit 480 by the transfer unit 470, and handed over to the chuck 461 at this delivery position A0. Then, the chuck 461 is moved to the first processing position A1, and the processing surface Wg of the processing target wafer W is roughly ground by the rough grinding unit 510, as depicted in FIG. 30D. As a result, a peripheral portion We of the processing target wafer W comes off and is removed starting from the modification layer M and a crack C, as depicted in FIG. 30E. At this time, since the modification surface R4 or R5 is formed at an interface between the processing target wafer W and the support wafer S and a bonding force thereat is reduced, the peripheral portion We can be removed appropriately.

Next, the chuck 461 is moved to the second processing position A2, and the processing surface Wg of the processing target wafer W is ground to a medium level by the intermediate grinding unit 520. In case that the peripheral portion We is not completely removed in the above-described rough grinding unit 510, the remaining peripheral portion We is completely removed in the intermediate grinding unit 520. That is, the peripheral portion We may be removed in two stages using the rough grinding unit 510 and the intermediate grinding unit 520. In such a case, a size of the peripheral portion We to be removed can be reduced in stages. That is, the size of the peripheral portion We to be removed in each the grinding units 510 and 520 is reduced.

Then, the chuck 461 is moved to the third processing position A3, and the processing surface Wg of the processing target wafer W is ground finely by the finishing grinding unit 530.

Thereafter, the chuck 461 is moved to the delivery position A0. Here, the processing surface Wg of the processing target wafer W is roughly cleaned by a cleaning liquid by using a cleaning liquid nozzle (not shown). At this time, the cleaning is performed to remove a contaminant on the processing surface Wg to some extent.

Subsequently, the combined wafer T is transferred into the second cleaning unit 500 from the delivery position A0 by the transfer unit 470. Then, in the second cleaning unit 500, the non-bonding surface Sn of the support wafer S is cleaned and dried in the state that the processing target wafer W is held by the transfer pad 472.

Next, the combined wafer T is transferred into the first cleaning unit 490 from the second cleaning unit 500 by the transfer unit 470. In the first cleaning unit 490, the processing surface Wg of the processing target wafer W is cleaned finely by a cleaning liquid by using the cleaning liquid nozzle (not shown). At this time, the processing surface Wg is cleaned to a required degree of cleanness and dried.

Subsequently, the combined wafer T is transferred into the wet etching apparatuses 440 and 441 in sequence by the wafer transfer device 432, and the processing surface Wg is wet-etched in two stages.

Then, the combined wafer T after being subject to all the processings required is transferred into the transition device 434 by the wafer transfer device 432, and then transferred into the cassette Ct on the cassette placing table 10 by the wafer transfer device 422. Then, the series of processes of the wafer processing in the substrate processing system 400 are completed.

In the above-described third exemplary embodiment, the same effects as obtained in the first and second exemplary embodiments can be achieved.

Further, the substrate processing system 400 according to the present exemplary embodiment may further include the periphery removing apparatus 210. The periphery removing apparatus 210 is stacked on top of, for example, the processing unit 480 and the first cleaning unit 490.

In this configuration, after the modification layer M and the modification surface R4 or R5 is formed in the processing unit 480, the peripheral portion We is removed starting from the modification layer M in the periphery removing apparatus 210. Thereafter, the rough grinding in the rough grinding unit 510, the intermediate grinding in the intermediate grinding unit 520, the finishing grinding in the finishing grinding unit 530, the cleaning of the non-bonding surface Sn in the second cleaning unit 500, the cleaning of the processing surface Wg in the first cleaning unit 490, and the wet etching of the processing surface Wg in the wet etching apparatuses 440 and 441 are performed in sequence.

Further, in the present exemplary embodiment, the laser head 103 for forming the modification layer M and the laser head 321 for forming the modification surface R4 or R5 are provided in the processing unit 480 which performs alignment of the combined wafer T. However, the apparatus configuration is not limited thereto. By way of example, a modification layer forming unit equipped with the laser head 103, the moving mechanism 104 and the elevating mechanism 105 and configured to form the modification layer M and an interface processing unit equipped with the laser head 321, the moving mechanism 322 and the elevating mechanism 323 and configured to form the modification surface R4 or R5 may be respectively provided separately from the processing unit 480. The modification layer forming unit and the interface processing unit may be disposed at any positions as long as they are within a range where the transfer unit 470 is capable of transferring the combined wafer T thereto. By way of example, the modification layer forming unit and the interface processing unit may be stacked on top of the processing unit 480. Alternatively, the modification layer forming unit and the interface processing unit may be disposed at a position adjacent to the processing unit 480 in the horizontal direction, for example, at a position opposite from the processing unit 480 with the moving mechanism 473 therebetween. Still alternatively, either one of the modification layer forming unit and the interface processing unit may be disposed within the processing apparatus 450. Still alternatively, both the modification layer forming unit and the interface processing unit may be disposed at an outside of the processing apparatus 50.

In addition, a CMP (Chemical Mechanical Polishing) apparatus configured to grind the processing surface Wg of the processing target wafer W may be provided in the substrate processing system 400 according to the present exemplary embodiment. In this case, a cleaning apparatus configured to clean the processing surface Wg after being ground may also be provided. For example, the CMP apparatus may be provided at a negative Y-axis side of the wafer transfer section 430 in the processing station 402. Further, the cleaning apparatus may be stacked on the wet etching apparatuses 440 and 441 at a positive X-axis side of the wafer transfer section 430, for example.

Moreover, in the substrate processing system 400 according to the present exemplary embodiment, the bonding of the processing target wafer W and the support wafer S are performed by the bonding apparatus at the outside of the substrate processing system 400. However, this bonding apparatus may be provided within the substrate processing system 400. In such a case, a cassette Cw capable of accommodating therein a multiple number of processing target wafer W, a cassette Cs capable of accommodating therein a multiple number of support wafers S, and the cassette Ct capable of accommodating therein the multiple number of combined wafers T are carried into/out of the carry-in/out station 401 of the substrate processing system 400. These cassettes Cw, Cs and Ct are arranged on the cassette placing table 410 in a row in the Y-axis direction.

The above exemplary embodiments have been described for the case where the processing target wafer W and the support wafer S are bonded directly. However, the processing target wafer W and the support wafer S may be bonded with an adhesive therebetween.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

EXPLANATION OF CODES

According to the exemplary embodiments, it is possible to remove a peripheral portion of one substrate in a combined substrate having multiple substrates bonded to each other, including the one substrate.

I claim:

1. A substrate processing system, comprising:
a modification layer forming apparatus configured to form a modification layer within a first substrate along a boundary between a peripheral portion of the first substrate to be removed and a central portion of the first substrate by irradiating laser light from a rear surface of the first substrate while holding a second substrate bonded to a front surface of the first substrate to form a combined substrate; and
a periphery removing apparatus configured to remove the peripheral portion by starting from the modification layer and reducing a thickness of the first substrate while holding the second substrate.

2. The substrate processing system of claim 1, wherein a lower end of the modification layer is located above a target surface of the first substrate when the thickness of the first substrate is reduced.

3. The substrate processing system of claim 1, wherein a lower end of the modification layer is located under a target surface of the first substrate when the thickness of the first substrate is reduced.

4. A substrate processing system, comprising:
a modification layer forming apparatus configured to form a modification layer within a first substrate along a boundary between a peripheral portion of the first substrate to be removed and a central portion of the first substrate by irradiating laser light from a rear surface of the first substrate while holding a second substrate bonded to a front surface of the first substrate to form a combined substrate; and
a periphery removing apparatus configured to
remove the peripheral portion by starting from the modification layer and performing a processing on the combined substrate in which the first substrate and the second substrate are bonded to each other to form a bonding force reduced portion with respect to the second substrate on the front surface of the peripheral portion.

5. A substrate processing system, comprising:
a modification layer forming apparatus configured to form a modification layer within a first substrate along a boundary between a peripheral portion of the first substrate to be removed and a central portion of the first substrate by irradiating laser light from a rear surface of the first substrate while holding a second substrate bonded to a front surface of the first substrate to form a combined substrate; and
a periphery removing apparatus configured to remove the peripheral portion by starting from the modification layer,
wherein the modification layer forming apparatus forms, by performing a processing on the combined substrate in which the first substrate and the second substrate are bonded to each other and a bonding force reduced portion with respect to the second substrate is formed on the front surface of the peripheral portion, the modification layer corresponding to the bonding force reduced portion.

6. The substrate processing system of claim 5, wherein the modification layer forming apparatus is further configured to form a diametrical modification layer extending outwards from the boundary within the first substrate in a diametrical direction, and form an annular split modification layer at an outer side than the boundary in the diametrical direction.

7. A substrate processing system, comprising:
a modification layer forming apparatus configured to form a modification layer within a first substrate along a boundary between a peripheral portion of the first substrate to be removed and a central portion of the first substrate in a combined substrate in which a second substrate are bonded to a front surface of the first substrate;
a periphery removing apparatus configured to remove the peripheral portion by starting from the modification layer; and an interface processing apparatus configured to perform a preset processing on an interface, at the peripheral portion, where the first substrate and a second substrate are bonded.

8. The substrate processing system of claim 7, wherein the interface processing apparatus modifies the interface by irradiating laser light to the interface of the first substrate or the second substrate before being bonded.

9. The substrate processing system of claim 7, wherein the interface processing apparatus etches the interface of the first substrate or the second substrate before being bonded.

10. The substrate processing system of claim 7, wherein the interface processing apparatus modifies the interface by irradiating laser light to the interface of the first substrate after being bonded.

11. The substrate processing system of claim 10, wherein a device layer is formed on a front surface of the first substrate, and the interface processing apparatus modifies the device layer by irradiating the laser light to the device layer.

12. A substrate processing method, comprising:
forming a modification layer within a first substrate along a boundary between a peripheral portion of the first substrate to be removed and a central portion of the first substrate;
removing the peripheral portion starting from the modification layer; and
bonding the first substrate and a second substrate,
wherein the forming of the modification layer, the bonding of the first substrate and the second substrate and the removing of the peripheral portion are performed in sequence.

13. The substrate processing method of claim 12, wherein in the forming of the modification layer, a diametrical modification layer extending outwards from the boundary within the first substrate in a diametrical direction is formed, and an annular split modification layer is formed at an outer side than the boundary in the diametrical direction.

14. The substrate processing method of claim 12, wherein a device layer is formed on a front surface of the first substrate, and
in the forming of the modification layer, the modification layer is formed by irradiating laser light from a rear surface of the first substrate.

15. The substrate processing method of claim 14, wherein in the forming of the modification layer, the modification layer is formed within the first substrate by irradiating the laser light from the rear surface of the first substrate while holding the second substrate bonded to the front surface of the first substrate.

16. The substrate processing method of claim 15, wherein in the removing of the peripheral portion, the peripheral portion is removed by starting from the modification layer while holding the second substrate.

17. A substrate processing method, comprising:
preparing a combined substrate in which a first substrate and a second substrate are bonded to each other;
forming a modification layer within the first substrate along a boundary between a peripheral portion of the first substrate to be removed and a central portion of the first substrate; and
removing the peripheral portion by starting from the modification layer,
wherein in the removing of the peripheral portion, the peripheral portion is removed by reducing a thickness of the first substrate while holding the second substrate.

18. The substrate processing method of claim 17, wherein a lower end of the modification layer is located above a target surface of the first substrate when the thickness of the first substrate is reduced.

19. The substrate processing method of claim 17, wherein a lower end of the modification layer is located under a target surface of the first substrate when the thickness of the first substrate is reduced.

20. A substrate processing method, comprising:
preparing a combined substrate in which a first substrate and a second substrate are bonded to each other;
forming a modification layer within the first substrate along a boundary between a peripheral portion of the first substrate to be removed and a central portion of the first substrate; and
removing the peripheral portion by starting from the modification layer,
wherein in the removing of the peripheral portion, the peripheral portion is removed by performing a processing on the combined substrate in which the first substrate and the second substrate are bonded to each other and a bonding force reduced portion with respect to the second substrate is formed on the front surface of the peripheral portion.

21. A substrate processing method, comprising:
preparing a combined substrate in which a first substrate and a second substrate are bonded to each other;
forming a modification layer within the first substrate along a boundary between a peripheral portion of the first substrate to be removed and a central portion of the first substrate; and
removing the peripheral portion starting from the modification layer,
wherein in the forming of the modification layer, a processing is performed on the combined substrate in which the first substrate and the second substrate are bonded to each other and a bonding force reduced portion with respect to the second substrate is formed on the front surface of the peripheral portion, and the modification layer is formed to correspond to the bonding force reduced portion.

22. A substrate processing method, comprising:
preparing a combined substrate in which a first substrate and a second substrate are bonded to each other;
forming a modification layer within the first substrate along a boundary between a peripheral portion of the first substrate to be removed and a central portion of the first substrate;
removing the peripheral portion starting from the modification layer; and
performing a preset processing on an interface, at the peripheral portion, where the first substrate and the second substrate are bonded.

23. The substrate processing method of claim 22, wherein the performing of the preset processing on the interface is performed before bonding the first substrate and the second substrate, and
wherein in the performing of the preset processing on the interface, the interface is modified by irradiating laser light to the interface of the first substrate or the second substrate before being bonded.

24. The substrate processing method of claim 22,
wherein the performing of the preset processing on the interface is performed before bonding the first substrate and the second substrate, and
wherein in the performing of the preset processing on the interface, the interface of the first substrate or the second substrate before being bonded is etched.

25. The substrate processing method of claim 22,
wherein the performing of the preset processing on the interface is performed after bonding the first substrate and the second substrate, and
wherein in the performing of the preset processing on the interface, the interface is modified by irradiating laser light to the interface of the first substrate after being bonded.

26. The substrate processing method of claim 25,
wherein a device layer is formed on a front surface of the first substrate, and
in the performing of the preset processing on the interface, the device layer is modified by irradiating laser light to the device layer.

27. A substrate processing method, comprising:
preparing a combined substrate in which a first substrate and a second substrate are bonded to each other;
forming a modification layer within the first substrate along a boundary between a peripheral portion of the first substrate to be removed and a central portion of the first substrate;
removing the peripheral portion starting from the modification layer;
forming a modification layer in a third substrate stacked on the first substrate after performing the forming of the modification layer, and the removing of the peripheral portion; and
removing a peripheral portion of the third substrate.

28. The substrate processing method of claim 27,
wherein in the forming of the modification layer in the third substrate, the modification layer is formed within the third substrate at an inner side than an edge of the first substrate in a diametrical direction.

\* \* \* \* \*